United States Patent

Dirksen et al.

[11] Patent Number: 6,160,622
[45] Date of Patent: *Dec. 12, 2000

[54] ALIGNMENT DEVICE AND LITHOGRAPHIC APPARATUS COMPRISING SUCH A DEVICE

[75] Inventors: Peter Dirksen, Valkenswaard; Antonius M. Nuijs, Eindhoven, both of Netherlands

[73] Assignee: ASM Lithography, B.V.

[ * ] Notice: This patent issued on a continued prosecution application filed under 37 CFR 1.53(d), and is subject to the twenty year patent term provisions of 35 U.S.C. 154(a)(2).

[21] Appl. No.: 09/099,505

[22] Filed: Jun. 18, 1998

[30] Foreign Application Priority Data

Dec. 29, 1997 [EP] European Pat. Off. .............. 97204127

[51] Int. Cl.⁷ .................................................. G01N 11/00
[52] U.S. Cl. .......................... 356/401; 356/400; 250/548
[58] Field of Search ................................... 356/399–401; 250/559.3, 548; 355/53

[56] References Cited

U.S. PATENT DOCUMENTS

| | | |
|---|---|---|
| 4,251,160 | 2/1981 | Bouwhuis et al. ....................... 356/401 |
| 4,356,392 | 10/1982 | Wittekoek et al. ...................... 250/201 |
| 4,737,823 | 4/1988 | Bouwer ....................................... 355/53 |
| 4,778,275 | 10/1988 | Van den Brink et al. ............... 356/401 |
| 5,026,166 | 6/1991 | Van der Werf ........................... 356/400 |
| 5,100,237 | 3/1992 | Wittekoek et al. ....................... 356/401 |
| 5,191,200 | 3/1993 | Van der Werf et al. .............. 250/201.4 |
| 5,481,362 | 1/1996 | Van Den Brink et al. . |
| 5,528,372 | 6/1996 | Kawashima . |
| 5,530,552 | 6/1996 | Mermangen et al. . |

FOREIGN PATENT DOCUMENTS

| | | |
|---|---|---|
| 049849981 | 8/1997 | European Pat. Off. .......... G03F 7/20 |
| 0498499B1 | 8/1997 | European Pat. Off. . |
| 63-29540 | 2/1988 | Japan . |
| 63-40316 | 2/1988 | Japan . |
| 97/35234 | 9/1997 | WIPO ............................... G03F 9/00 |
| WO 97/32241 | 9/1997 | WIPO . |

OTHER PUBLICATIONS

Dictionary of Electronic Terms, 1970 pp. 46, Col. 2.

*Primary Examiner*—Robert Kim
*Attorney, Agent, or Firm*—Pillsbury Madison & Sutro LLP

[57] ABSTRACT

An alignment device, for use in a lithographic apparatus, for aligning a first object, provided with a first alignment mark relative to a second object, provided with a second alignment mark, employs as a radiation source a laser which emits an alignment beam having a wavelength which is of the order of 1000 nm and to the order of 1100 nm.

23 Claims, 15 Drawing Sheets

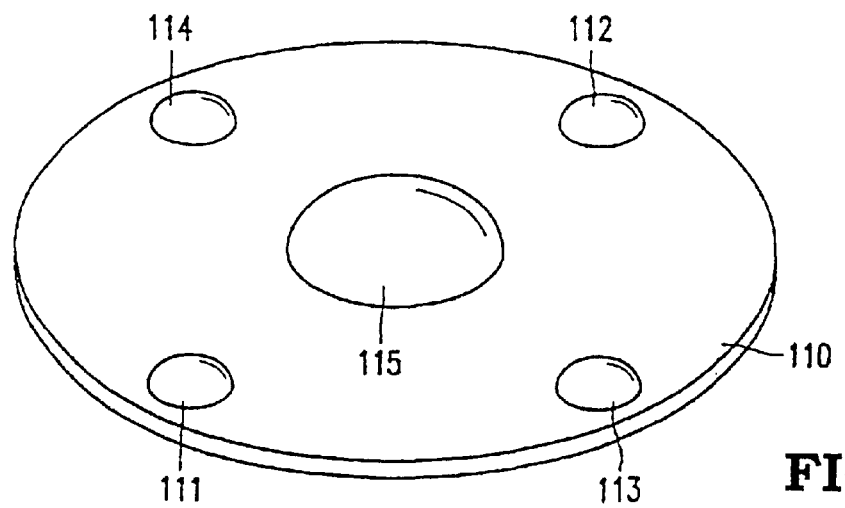
FIG. 11
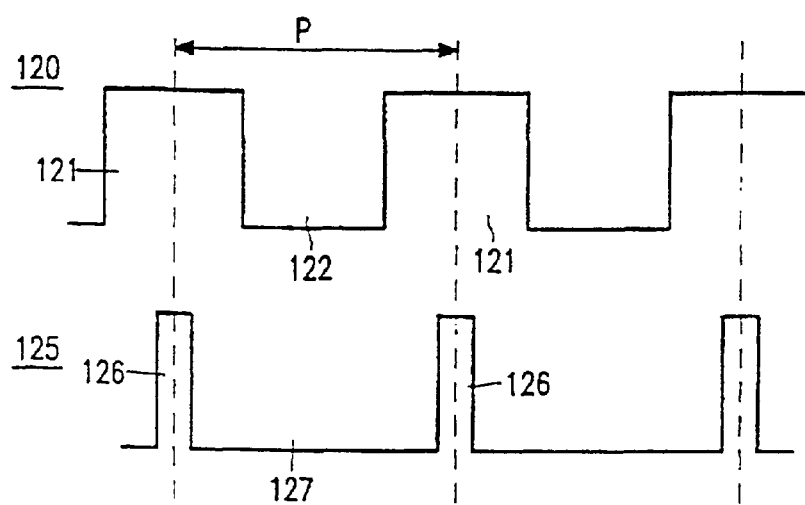
FIG. 12
FIG. 13
FIG. 14
FIG. 15

ALIGNMENT DEVICE AND LITHOGRAPHIC APPARATUS COMPRISING SUCH A DEVICE

BACKGROUND OF THE INVENTION

The invention relates to an alignment device for aligning a first object, which is provided with at least a first alignment mark, with respect to a second object which is provided with at least a second alignment mark, said device comprising a radiation source for supplying at least an alignment beam, a first object holder, a second object holder, an imaging system for imaging said first alignment mark and said second alignment mark onto each other, and a radiation-sensitive detection system arranged in the path of selected alignment beam portions coming from a first alignment mark and a second alignment mark onto which the first alignment mark is imaged, the output signal of the detection system being indicative of the extent to which the first and the second object are aligned with respect to each other.

The invention also relates to a lithographic apparatus for repetitively imaging a mask pattern on a substrate, in which apparatus such an alignment device for aligning a mask with respect to a substrate is used. The mask has at least a mask alignment mark and the substrate has at least a substrate alignment mark.

Aligning, for example, a mask alignment mark and a substrate alignment mark with respect to each other is understood to mean both directly and indirectly aligning these alignment marks. In the case of direct alignment, a substrate alignment mark is imaged on a mask alignment mark, or conversely, and the detection system is arranged behind the last mark. In the case of indirect alignment, both the substrate alignment mark and the mask alignment mark are imaged on different parts of a further, reference, mark, and the detection system is arranged behind the reference mark. In the latter case, the extent to which the substrate alignment mark and the mask alignment mark are aligned with respect to each other is determined by detecting to what extent both the substrate alignment mark and the mask alignment mark are aligned with respect to the reference mark.

The selected alignment beam portions are those portions of the alignment beam which are effectively used to image the first alignment mark on the second alignment mark. If the alignment marks are diffraction gratings, the selected alignment beam portions are the beam portions diffracted in given orders, for example the first orders, by the alignment marks.

U.S. Pat. No. 4,778,275 describes an optical lithographic projection apparatus for repetitive and reduced imaging of a mask pattern, for example, the pattern of an integrated circuit (IC) on a number of IC areas, or substrate fields, of the substrate. The mask and the substrate ale moved with respect to each other between two successive illuminations, for example, along two mutually perpendicular directions in a plane parallel to the substrate plane and the mask plane so as to successively image the mask pattern in all substrate fields.

Integrated circuits are manufactured by means of diffusion and masking techniques. A number of different mask patterns are consecutively imaged on one and the same location on a semiconductor substrate. Between the consecutive imaging steps on the same locations, the substrate must undergo the desired physical and chemical changes. To this end, the substrate must be removed from the apparatus after it has been illuminated with a first mask pattern and, after it has undergone the desired process steps, it must be placed in the apparatus again in the same position so as to illuminate it with a second mask pattern, and so forth. It must then be ensured that the projections of the second mask pattern and of the subsequent mask patterns are positioned accurately with respect to the substrate.

The lithographic techniques can also be used in the manufacture of other structures having detail dimensions of the order of micrometers or less, such as structures of integrated planar optical systems, magnetic heads, or structures of liquid crystalline display panels. Also in the manufacture of these structures, images of the mask pattern must be aligned very accurately with respect to a substrate.

In order to be able to realize the desired, great positioning accuracy, within several tenths of one micrometer in the apparatus according to U.S. Pat. No. 4,778,275, of the projection of the mask pattern with respect to the substrate, this apparatus comprises a device for aligning the substrate with respect to the mask pattern with which an alignment mark provided in the substrate is imaged on an alignment mark provided in the mask. If the image of the substrate alignment mark accurately coincides with the mask alignment mark, the substrate is correctly aligned with respect to the mask pattern. In the known alignment device, a HeNe laser beam is used as an alignment beam.

In connection with the increasing number of electronic components per IC and the resultant smaller dimensions of these components, increasingly stricter requirements are imposed on the accuracy with which ICs can be manufactured. This means that a mask pattern must be aligned with respect to the substrate fields with an increasing accuracy.

The alignment device described in U.S. Pat. No. 4,778,275 has hitherto worked to full satisfaction, but it is to be expected that with decreasing detail sizes, or line widths, of the IC patterns and with the use of novel technologies in IC manufacture, the alignment device may present problems relating to its reliability and accuracy. These problems relate to the symmetry of an alignment mark, required for alignment, and the symmetry of the processes to which the substrate, hence also the substrate alignment mark, is subjected. The known alignment device is only reliable if both the alignment mark and the processes are symmetrical.

In the manufacture of new-generation ICs with smaller line widths, the resolving power of the projection lens system used for the mask pattern projection must be increased, which means that the numerical aperture of this system must be increased. This means that the depth of focus of this system decreases. Since there will be some curvature of the image field at the desired relatively large image field of the projection lens system, there is substantially no tolerance for the evenness of the substrate. To maintain the desired evenness of the substrate, it may be polished, in between to illuminations of the substrate, by means of the chemical mechanical polishing (CMP) process. This polishing process is found to cause an asymmetrical distortion in a substrate alignment mark implemented as a grating. Besides the CMP process, the manufacture of ICs has also become more and more complex by the use of non-uniform etching processes and the provision of an increasing number of metal layers on the substrate. This also leads to an asymmetrical distortion of the substrate alignment mark. Moreover, these substrates, and hence the alignment marks, are coated with a number of transparent layers, such as oxide layers, nitride layers and poly layers. These layers may be deposited isotropically, but they may cause interference effects in the alignment beam affecting the alignment. Particularly the combination of asymmetry in the alignment mark and interference effects may give rise to relatively large alignment errors.

SUMMARY OF THE INVENTION

It is an object of the present invention to provide an alignment device in which the above-mentioned problems do not occur and which is more accurate and more reliable than the known devices. This alignment device is characterized in that the wavelength of the alignment beam is of the order of at least 1000 nm and at most 1100 nm.

The invention is based on the recognition that, taking into account the relevant parameters of the period of the grating mark, the chosen diffraction orders, the profile of the mark including the asymmetrical shape and the depth, the deposited dielectric layers and metal layers and the standard deviation of the alignment error, a more accurate and reliable alignment error detection is possible as the wavelength of the alignment beam is larger. The upper limit for this wavelength is limited by the material of the substrate; for a wavelength of more than 1100 nm, silicon becomes transparent to the alignment beam and its rear side is visible to the alignment device. The standard deviation is the deviation which results from a variation of the parameter: layer thickness or depth of the mark. The fact that a choice has been made for this standard deviation means that the criterion is not the average value of zero but that the position of the substrate alignment mark, observed by the device, must be constant. The requirement is that the observed position of the mark remains constant, for example, at varying layer thicknesses, even if the mark is asymmetrical and is independent of the thickness of the radiation-sensitive layer on the substrate, or the layer packet deposited on the mark.

It is to be noted that the English-language abstract of JP-A 63-40316 states that interferences in the radiation-sensitive layer result in an arbitrary variation of the intensity of the reflected alignment beam, so that the diffraction pattern becomes indefinite. However, in this abstract it is proposed to vary the wavelength of the read beam. This solution has the same drawback as the alternative solution of using a broadband alignment beam, namely the elements of the alignment device must be made suitable for broadband radiation, which complicates this device to a considerable extent. Moreover, a weak detection signal would then be obtained and no order diaphragm for selecting suitable diffraction orders could be placed in the alignment beam.

A preferred embodiment of the alignment device is further characterized in that the radiation source is constituted by one of the following lasers:

an Nd:YAG laser having a wavelength of 1064 nm;
an Nd:YLF laser having a wavelength of 1047 nm;
a semiconductor laser having a wavelength of 980 nm.

These lasers are already manufactured in large numbers for other applications and are very suitable for use in the novel alignment device.

The alignment device may be further characterized in that the detection system comprises an InGaAs detector.

This detector has the desired sensitivity to said wavelengths.

The invention also relates to a lithographic apparatus for imaging a mask pattern on a substrate, which apparatus comprises an illumination unit for illuminating a mask with a projection beam, a mask holder, a substrate holder, and a projection system arranged between the mask holder and the substrate holder, and further comprises a device for aligning the mask and the substrate with respect to each other. This apparatus is characterized in that the alignment device is constituted by the alignment device described hereinbefore, wherein the substrate and the mask constitute the first and the second object for the alignment device.

The most customary embodiment of this apparatus is further characterized in that the projection beam is a beam of electromagnetic radiation, and the projection system is an optical projection system, and in that the imaging system of the alignment device also comprises the optical projection lens system.

However, the projection beam may also be a charged-particle beam such as an ion beam, an electron beam or a beam of X-ray radiation, for which the projection system is adapted to the type of radiation. For example, if the projection beam is an electron beam, the projection system will be an electron lens system. This projection system then no longer forms part of the imaging system of the alignment device.

At the above-mentioned wavelengths for the alignment beam, imaging errors, namely a magnification error and a focusing error, are produced when using the projection system for imaging a first alignment mark on a second alignment mark. The reason is that the projection system is optimized for the short-wave projection radiation, for example deep UV radiation. The difference between the wavelengths of the projection radiation and that of the alignment radiation is now even larger than in known apparatuses, in which the alignment radiation has a wavelength of 633 nm.

To prevent these imaging errors, the apparatus according to the invention is further characterized in that a correction element for correcting the direction and convergence of the alignment beam portion reflected by an alignment mark is arranged between the substrate holder and the mask holder, said correction element having a dimension which is considerably smaller than the diameter of the projection beam in the plane of the correction element.

The principle of using such a correction element in an alignment device is described in U.S. Pat. No. 5,100,237. This patent also gives details about the position of the correction element, and some embodiments of this element are mentioned. In an alignment device with the proposed wavelength for the alignment beam, the correction element is even more needed than in the apparatus described in U.S. Pat. No. 5,100,237.

These and other aspects of the invention are apparent from and will be elucidated with reference to the embodiments described hereinafter.

BRIEF DESCRIPTION OF THE DRAWING

In the drawings:

FIG. 11 shows an. order diaphragm provided with correction elements, FIGS. 12, 13, 14 and 15 show parts of different embodiments of an associated first grating mark.

DETAILED DESCRIPTION OF THE INVENTION

Figure 1:
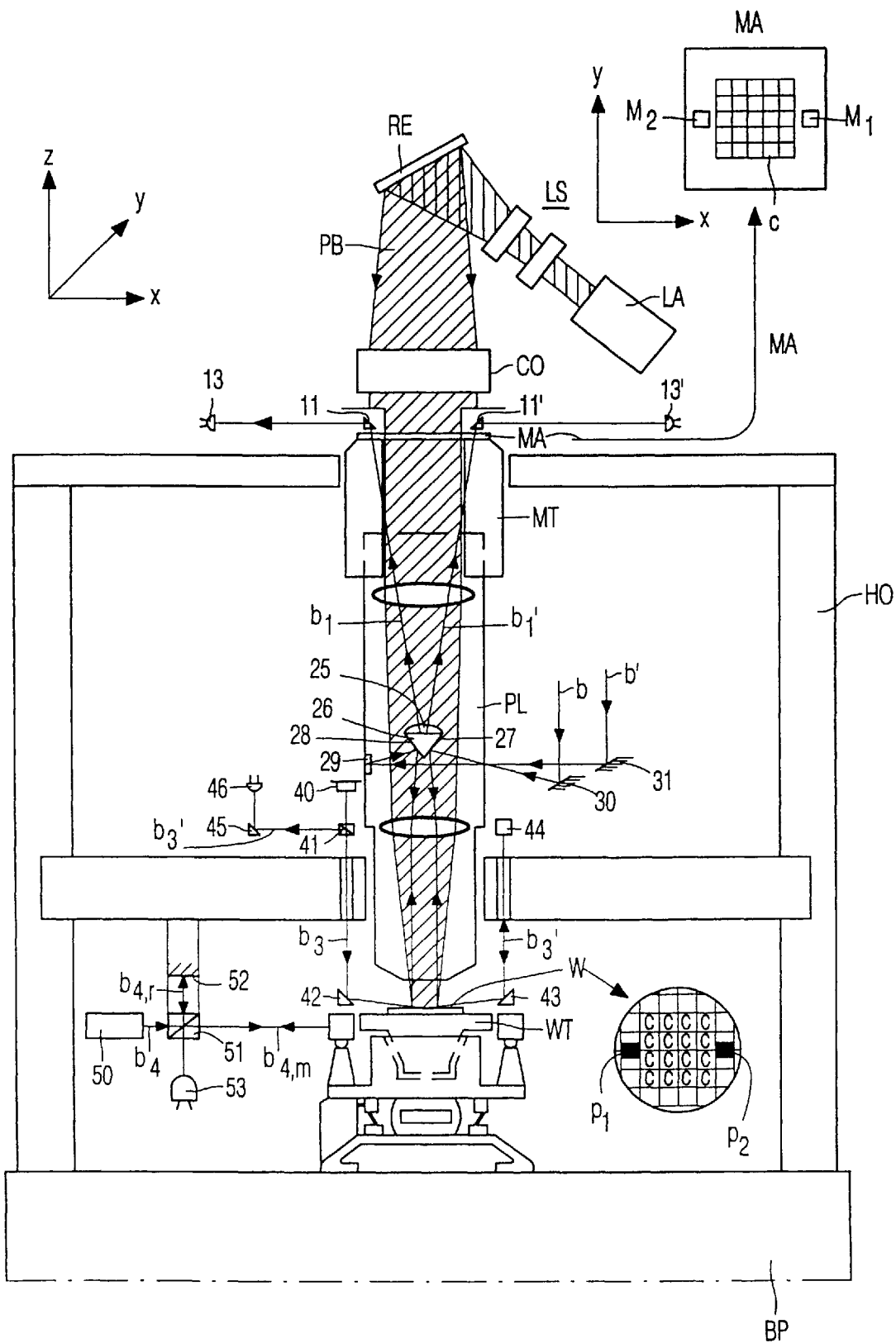
FIG. 1 shows an embodiment of a lithographic apparatus for repetitively imaging a mask pattern on a substrate.

The invention will now be described in greater detail with reference to the figures of the drawing.

FIG. 1 shows the principle and an embodiment of a lithographic apparatus for repetitively imaging a mask pattern on a substrate. The main components of this apparatus are a projection column, in which a mask MA provided with the mask pattern C to be imaged is arranged, and a movable substrate table WT with which the substrate W can be positioned with respect to the mask pattern. The apparatus further comprises an illumination unit which consists of a radiation source LA, for example a Krypton-Fluoride laser, a lens system LS, a reflector RE and a condensor lens CO. The projection beam PB supplied by the illumination unit illuminates the mask pattern C present in the mask MA which is arranged on a mask holder (not shown) in the mask table MT.

The projection beam PB passing through the mask pattern C traverses a projection lens system PL arranged in the projection column and shown only diagrammatically, which system forms an image of the pattern C each time in one of the many IC areas, or substrate fields, of the substrate W. The projection lens system has, for example a magnification M of ¼, a numerical aperture of the order of 0.5 and a diffraction-limited image field with a diameter of the order of 0.25. These numbers are arbitrary and may vary with every new generation of the projection apparatus. The substrate W is arranged in a substrate holder (not shown) which forms part of a substrate table WT supported in, for example, air bearings. The projection lens system PL and the substrate table WT are arranged in a housing HO which is closed at its lower side by a base plate BP of, for example granite, and at its upper side by the mask table MT.

As is shown in the top-right-hand corner of FIG. 1, the mask MA has two alignment marks $M_1$ and $M_2$. These marks preferably consist of diffraction gratings, but they may be alternatively formed by other periodical structures. The alignment marks are preferably two-dimensional, i.e. they extend in two mutually perpendicular directions, the X and Y directions in FIG. 1. The substrate W, for example a semiconductor substrate on which the pattern C must be imaged in the different substrate fields, comprises a plurality of alignment marks, preferably also two-dimensional diffraction gratings, two of which, $P_1$ and $P_2$, are shown in FIG. 1. The marks $P_1$ and $P_2$ are located outside the substrate fields where the images of the mask pattern must be formed. The substrate alignment marks $P_1$ and $P_2$ are preferably formed as phase gratings and the mask alignment marks $M_1$ and $M_2$ are preferably formed as amplitude gratings.

Figure 2:
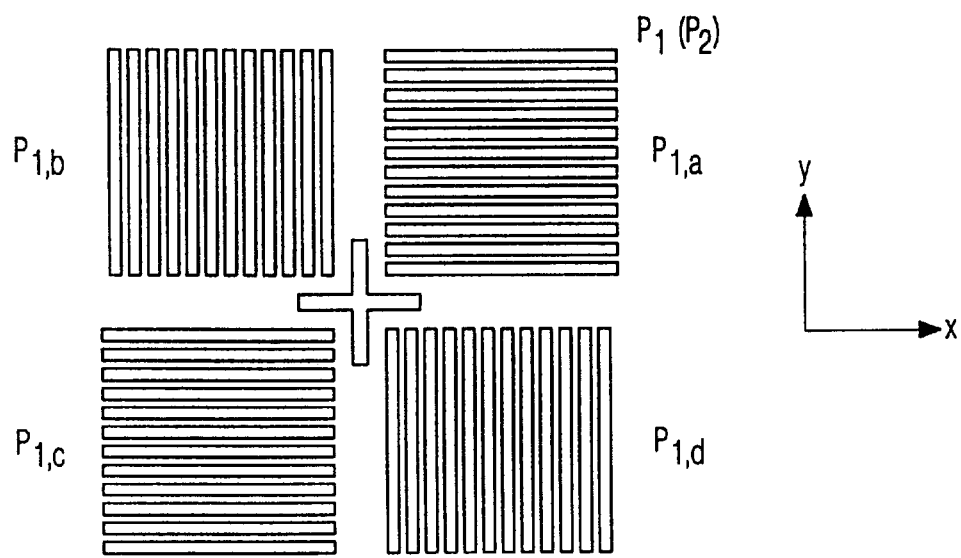
FIG. 2 shows an embodiment of an alignment mark in the form of a two-dimensional grating.

FIG. 2 shows one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$ are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 $\mu$m and the sub-gratings $P_{1,a}$ and $P_{1,d}$ have a grating period of, for example, 17.6 $\mu$m. Each sub-grating may cover a surface area of, for example, 200×200 $\mu$m. An alignment accuracy which, in principle, is less than 0.1 $\mu$m can be achieved with these grating marks and a suitable optical system. Different grating periods have been chosen so as to increase the capture range of the alignment device.

FIG. 1 shows a first embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$. The alignment beam b is reflected to the reflective surface 27 of a prism 26 by means of a reflecting element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example a prism which directs the radiation passed by the mark $M_2$ to a radiation-sensitive detector 13, is arranged above the mark $M_2$.

Figure 3:
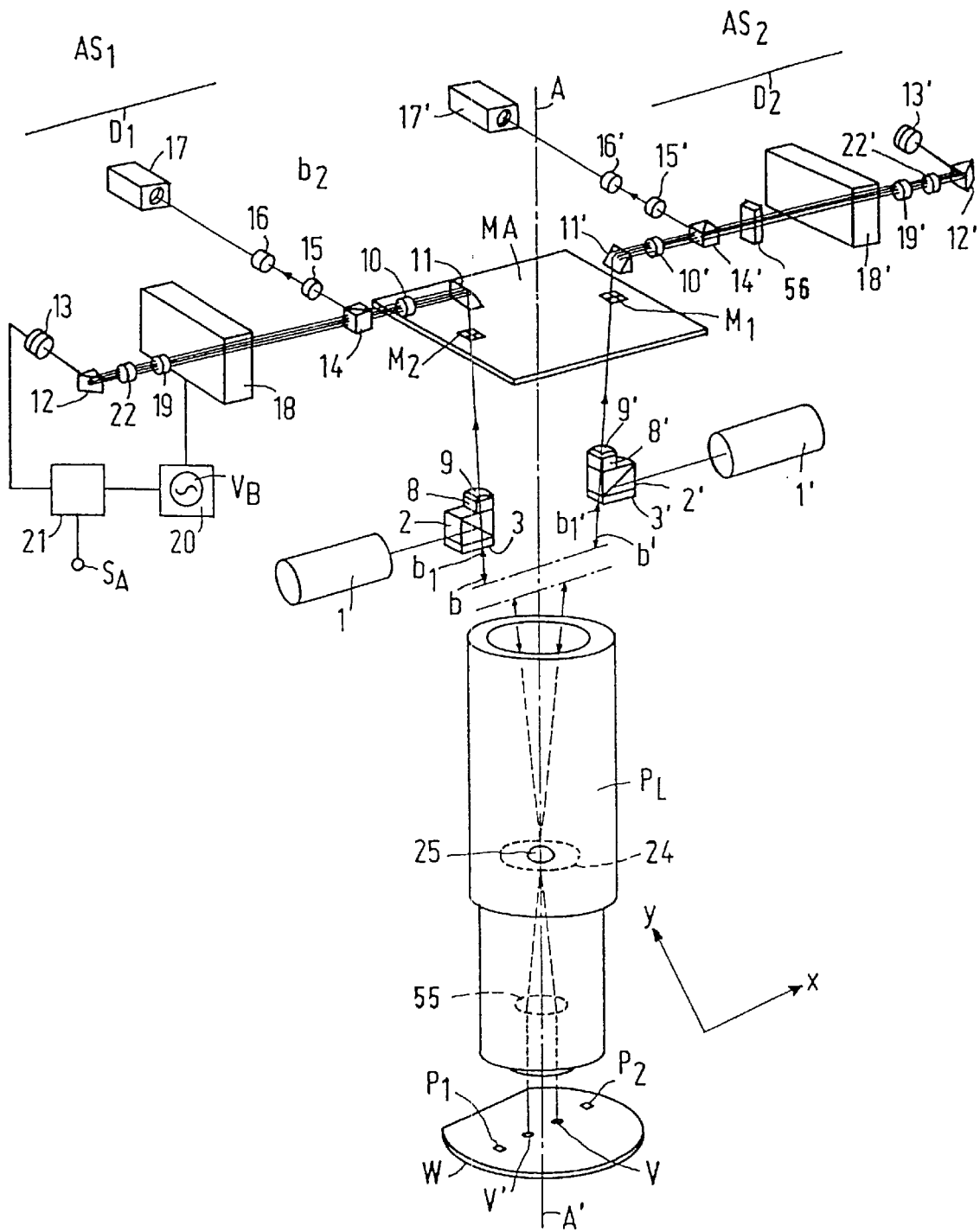
FIG. 3 shows an embodiment of the lithographic apparatus comprising a double alignment device.

The second alignment beam b' is reflected to a reflector 29 in the projection lens system PL by a mirror 31. This reflector sends the beam b' to a second reflecting surface 28 of the prism 26, which surface directs the beam b' onto the substrate alignment mark $P_1$. This mark reflects a part of the radiation of the beam b' as beam $b'_1$ to the mask alignment mark $M_1$ where an image of the mark $P_1$ is formed. The radiation of the beam $b'_1$ passing through the mark $M_1$ is directed towards a radiation-sensitive detector 13' by a reflector 11'. The operation of the double alignment device will be further described with reference to FIG. 3 showing a further embodiment of such a device.

The projection apparatus further comprises a focus error detection system for determining a deviation between the image plane of the projection lens system PL and the surface of the substrate W, so that this deviation can be corrected, for example, by moving the projection lens system with respect to the substrate holder along the optical axis of the projection lens system. The focus error detection system may be constituted by the elements 40, 41, 42, 43, 44, 45 and 46 which are arranged in a holder (not shown) which is fixedly connected to the holder of the projection lens system. Element 40 is a radiation source, for example a diode laser, emitting a focusing beam $b_3$. This beam is directed onto the substrate at a small angle by a reflecting prism 42, while the focusing beam reflected by the substrate is directed towards a retroreflector 44 by the prism. This element reflects the beam in itself, so that the focusing beam once more traverses the same path as beam b'$_3$, via reflection on the prism 43 to the substrate and from this substrate to the prism 42. The reflected focusing beam b'$_3$, then reaches a beam splitter 41 which reflects the beam to a further reflector 45. This reflector sends the focusing beam to a radiation-sensitive detection system 46. This detection system consists of, for example a position-sensitive detector or of two separate detectors. The position of the radiation spot formed by the beam b' on this system is dependent on the extent to which the image plane of the projection lens system coincides with the surface of the substrate W. For an extensive description of the focus error detection system, reference is made to U.S. Pat. No. 4,356,392.

Instead of this focus error detection system with a monochromatic focusing beam, a focus-and-tilt detection system working with a broadband beam is preferably used. Such a broadband detection system is described in U.S. Pat. No. 5,191,200.

In order to determine the X and Y positions of the substrate very accurately, the apparatus comprises a composite interferometer system having a plurality of measuring axes, of which only a one-axis sub-system is shown in FIG. 1. This sub-system comprises a radiation source 50, for example a laser, a beam splitter 51, a stationary reference mirror 52 and a radiation-sensitive detector 53. The beam b$_4$ emitted by the source 50 is split by the beam splitter 51 into a measuring beam b$_{4,m}$ and a reference beam b$_{4,r}$. The measuring beam reaches the measuring mirror in the form of a reflective side face of the substrate table, or preferably a reflective side face of the substrate holder which forms part of the substrate table and on which the substrate is rigidly secured. The measuring beam reflected by the measuring mirror is combined by the beam splitter 51 with the reference beam reflected by the reference mirror 52 so as to form an interference pattern at the location of the detector 53. The composite interferometer system may be implemented as described in U.S. Pat. No. 4,251,160 and then comprises two measuring axes. The interferometer system may alternatively comprise three measuring axes as described in U.S. Pat. No. 4,737,823, but is preferably a system with at least five measuring axes as described in EP-A 0 498 499.

By making use of a substrate position detection device in the form of a composite interferometer system, the positions of, and the mutual distances between, the alignment marks P$_1$ and P$_2$ and the marks M$_1$ and M$_2$ can be fixed during alignment in a system of co-ordinates defined by the interferometer system. Then it is not necessary to refer to a frame of the projection apparatus or to a component of this frame, so that variations in this frame due to, for example temperature variations, mechanical creep and the like do not affect the measurements.

FIG. 3 shows the principle of the double alignment device with reference to an embodiment which is distinguished from that in FIG. 1 by a different manner of coupling the alignment beams b and b' into the projection lens system. The apparatus comprises two separate and identical alignment systems AS$_1$ and AS$_2$ which are positioned symmetrically with respect to the optical axis AA' of the projection lens system PL. The alignment system AS$_1$ is associated with the mask alignment mark M$_2$ and the alignment system AS$_2$ is associated with the mask alignment mark M$_1$. The corresponding elements of the two alignment systems are denoted by the same reference numerals, those of the elements of the system AS$_2$ being distinguished by their primed notation.

The structure of the system AS$_1$ as well as the way in which the mutual position of the mask alignment mark M$_2$ and, for example, the substrate alignment mark P$_2$ is determined will now be described first.

The alignment system AS$_1$ comprises a radiation source 1 which emits an alignment beam b. This beam is reflected towards the substrate by a beam splitter 2. The beam splitter may be a partially transparent reflector or a partially transparent prism, but is preferably a polarization-sensitive splitting prism which is succeeded by a quarter-wavelength plate 3. The projection lens system PL focuses the alignment beam b to a small radiation spot V having a diameter of the order of 1 mm on the substrate W. This substrate reflects a part of the alignment beam as beam b$_1$ in the direction of the mask MA. The beam b$_1$ traverses the projection lens system PL, which system images the radiation spot on the mask. Before the substrate is arranged in the projection column, it has been prealigned in a prealignment station, for example the station described in U.S. Pat. No. 5,026,166, so that the radiation spot V is located on the substrate alignment mark P$_2$. This mark is then imaged by the beam b$_1$ on the mask alignment mark M$_2$. Taking the magnification M of the projection lens system into account, the dimension of the mask alignment mark M$_2$ is adapted to that of the substrate alignment mark P$_2$ so that the image of the mark P$_2$ accurately coincides with the mark M$_2$ if the two marks are mutually positioned in the correct manner.

On its path to and from the substrate W, the alignment beams b and bi have traversed twice the quarter wavelength plate 3 whose optical axis extends at an angle of 45° to the direction of polarization of the linearly polarized beam b coming from the source 1. The beam passing through the plate 3 then has a direction of polarization which is rotated 90° with respect to that of the beam b, so that the beam b$_1$ is passed by the polarization splitting prism 2. The use of the polarization splitting prism in combination with the quarter-wavelength plate provides the advantage of a minimum radiation loss when coupling the alignment beam into the radiation path of the alignment system.

The beam b$_1$ passed by the alignment mark M$_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of the sub-detectors comprise information about the extent to which the mark M$_2$ coincides with the image of the mark P$_2$. These signals may be processed electronically and used for moving the mask with respect to the substrate by means of driving systems (not shown) so that the image of the substrate alignment mark P$_2$ coincides with the mask alignment mark M$_2$.

A beam splitter 14 splitting a part of the beam b$_1$ as beam b$_2$ may be arranged between the prism 11 and the detector 13. The split beam is then incident via, for example, two lenses 15 and 16 on a television camera which is coupled to a monitor (not shown) on which the alignment marks P$_2$ and M$_2$ are visible to an operator of the apparatus.

Analogously as described above for the alignment marks P$_2$ and M$_2$, the marks M$_1$ and P$_1$, and M$_1$ and P$_2$, respectively, can be aligned with respect to each other. The alignment system AS$_2$ is used for the last-mentioned alignments.

For further details about the alignment procedures by means of the double alignment system, reference is made to U.S. Pat. No. 4,778,275.

The alignment marks $P_1$ and $P_2$ in the form of gratings or other diffraction elements split the alignment beams incident thereon into a non-deflected zero-order sub-beam and a plurality of, deflected, first-order and higher-order sub-beams. Of these sub-beams, only those having the same order number are selected in the alignment device so as to image the substrate alignment mark on a mask alignment mark. For the selection of the sub-beams, an order diaphragm is arranged in the projection lens system at a position where the sub-beams diffracted in the different diffraction orders are spatially separated to a sufficient extent, for example, in the Fourier plane of the projection lens system. This order diaphragm is diagrammatically indicated by means of the reference numeral 55 in FIG. 3 and consists of a plate which is non-transmissive to the alignment radiation and has a plurality of radiation-transmissive apertures or areas. If the alignment mark has a two-dimensional grating structure, the plate has four apertures: two for the sub-beams diffracted in the relevant order in the plus and minus X direction and two for the sub-beams diffracted in the plus and minus Y direction. Moreover, an additional order diaphragm improving the selection of the desired order is preferably arranged in the detection branch, i.e. the part of the radiation path from the mask alignment mark to the detector 13, 13'. The sub-beams diffracted in the first orders are preferably used for the alignment.

The alignment device described operates satisfactorily if the substrate alignment mark is symmetrical and the processes to which the substrate, and hence the alignment marks present on the substrate, are subjected are symmetrical processes. Only if these two conditions are met, the position of the axis of symmetry of a substrate alignment mark observed with the alignment device is a constant, and the alignment position remains constant throughout the process steps. However, the lithographic process techniques have become complex in the course of time and are becoming even more complex due to the use of non-uniform etching processes, chemical-mechanical polishing techniques and the deposition of an increasing number of metal layers on the substrate. As a result, material is deposited or removed mainly on one side of a substrate alignment mark, so that this mark becomes asymmetrical. Moreover, the substrate alignment marks are coated with transparent dielectric layers having poorly controlled thicknesses. Although the deposition of the customary oxide, nitride and poly layers is, in principle, isotropic, the interference effects which may occur in these layers in combination with the resultant asymmetry of the marks may cause inadmissibly large alignment errors. If the alignment error is plotted versus the layer thickness in a graph, an oscillation curve is obtained. Upon each change of a layer thickness by $\lambda/4.n$, in which n is the refractive index of the layer, the alignment error changes from a maximum to a minimum. When using alignment radiation at a wavelength of 633 nm (from a HeNe laser), a change of thickness of an oxide layer by 100 nm will occur during a full oscillation period. Since the number of transparent layers increases even more, it will be extremely difficult to limit the layer thickness variation to a fraction of 100 nm.

To reduce the influence of said effects on the alignment signal to a considerable extent, a wavelength of the alignment beam(s) of the order of 1000 nm is chosen in accordance with the invention. To minimize the disturbance of the alignment signal, it has been found that the wavelength of the alignment beam must be as large as possible. On the other hand, a maximum value is imposed on this wavelength because a silicon substrate becomes transparent, for example, at wavelengths of more than 1100 nm. At this wavelength, the alignment device could observe the lower side of the substrate, so that other errors are introduced.

In accordance with the invention, an Nd:YAG laser having a wavelength of 1064 nm is used for the radiation source 1 (1') of the alignment device. Alternatively, an Nd:YLF laser having a wavelength of 1047 nm may be used. A further alternative is the use of a semiconductor diode laser having a wavelength of 980 nm.

Figure 4:
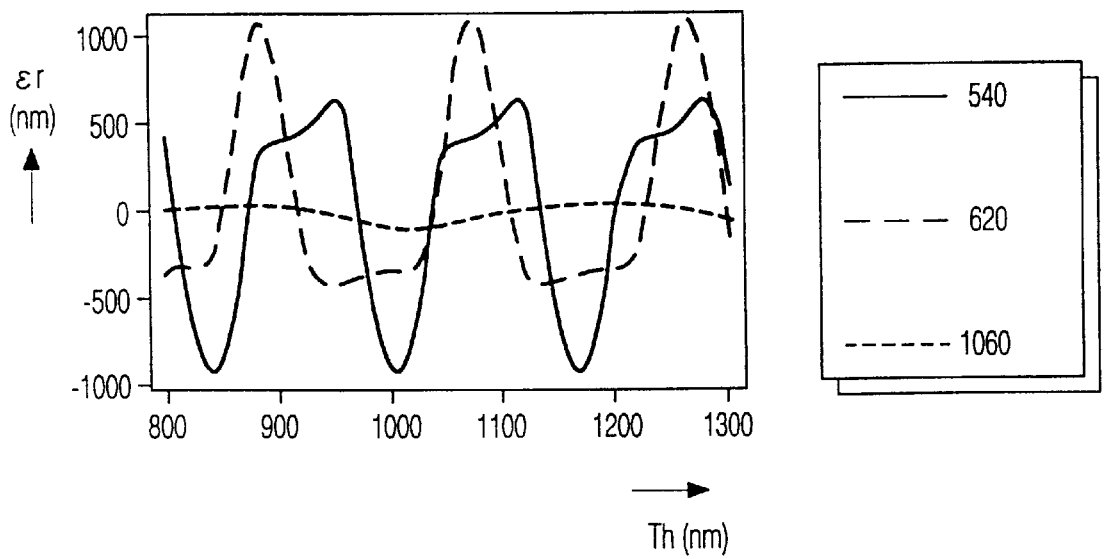
FIG. 4 shows the alignment error as a function of the thickness of a photosensitive layer for the new alignment wavelength and for known alignment wavelengths.

The effect of the choice of a longer wavelength for the alignment radiation is illustrated in FIG. 4. In this Figure, the alignment error Er is shown as a function of the thickness Th of the photosensitive layer on the substrate, at three different wavelengths. It is immediately clear that the alignment error is considerably smaller at the wavelength of 1060 nm than that which occurs when one of the two other wavelengths is used.

In accordance with a further aspect of the invention, the detector 13 (13') of the alignment device is constituted by a semiconductor detector, whose radiation-sensitive element is composed of the materials Indium, Gallium and Arsenic. Such an InGaAs detector has the desired sensitivity to the chosen wavelengths.

Since the projection lens system PL is designed for the wavelength of the projection beam PB which, in connection with the desired large resolving power of the apparatus should be as small as possible, deviations may occur when this system is used for imaging the alignment marks $P_1$, $P_2$ and $M_1$, $M_2$ on each other by means of the alignment beam. For example, the substrate alignment marks will not be imaged in the plane of the mask pattern in which the mask alignment marks are located, but will be imaged in a plane at a given distance therefrom. This distance is determined by the difference between the wavelengths of the projection beam and the alignment beam and by the difference between the refractive indices of the material of the elements of the projection lens system for the two wavelengths. In a known lithographic apparatus, in which the projection beam has a wavelength of, for example 248 nm and the alignment beam has a wavelength of 633 nm, this distance may be up to 2 m. Moreover, due to said wavelength difference, a substrate alignment mark is imaged on a mask alignment mark with a magnification which deviates from the desired magnification. It will be evident that the magnification error and said distance increase at a larger difference between the wavelengths of the projection beam and the alignment beam, and that corrective measures become even more necessary.

A correction, which is preferred because of its simplicity, consists of accommodating a correction lens 25, or another refracting or diffracting element, in the projection lens system, as is shown in FIGS. 1 and 3. The correction lens is arranged at such a height in the projection column that, on the one hand, only the sub-beams with the selected diffraction orders, for example the first orders, coming from the substrate alignment mark are influenced with this lens and, on the other hand, this lens has a negligible influence on the projection beam and the mask pattern image formed thereby.

Figure 5:
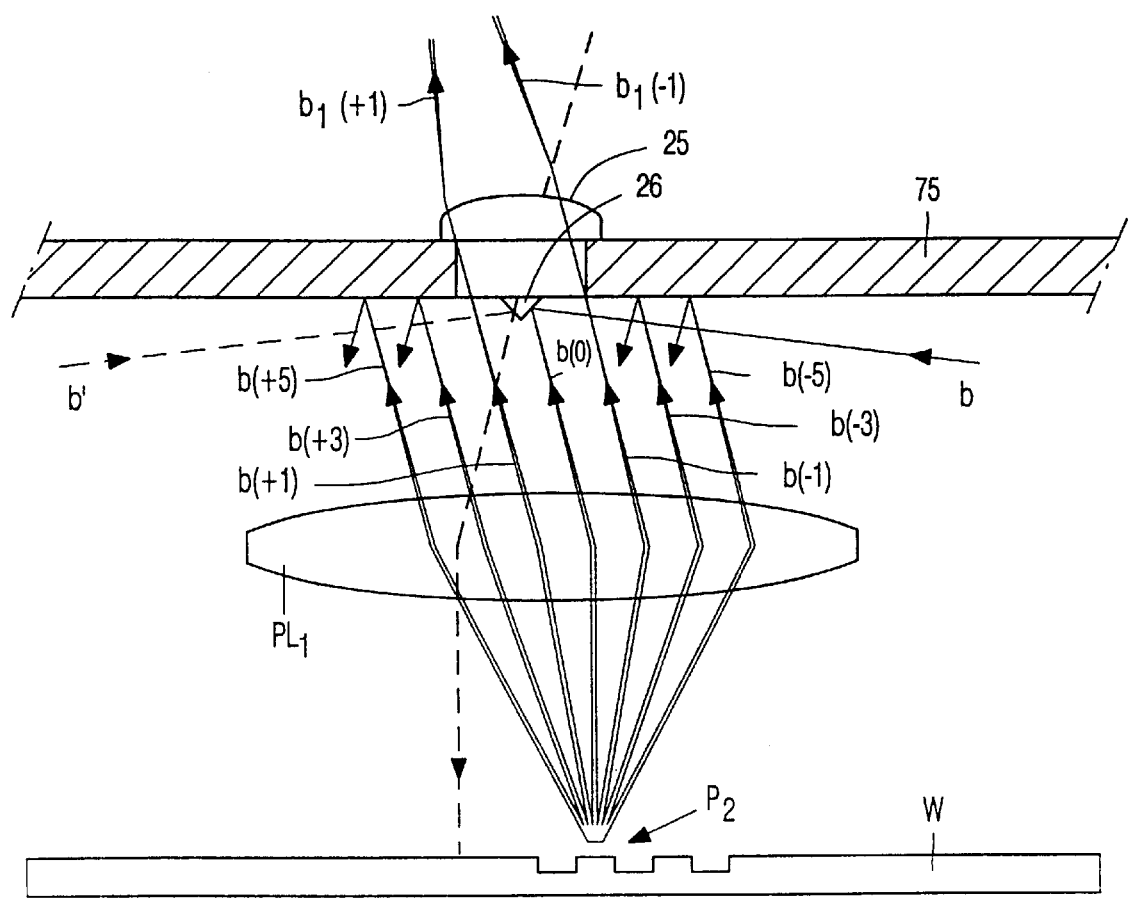
FIG. 5 shows the operation of a correction lens for the alignment radiation.
Figure 5A:
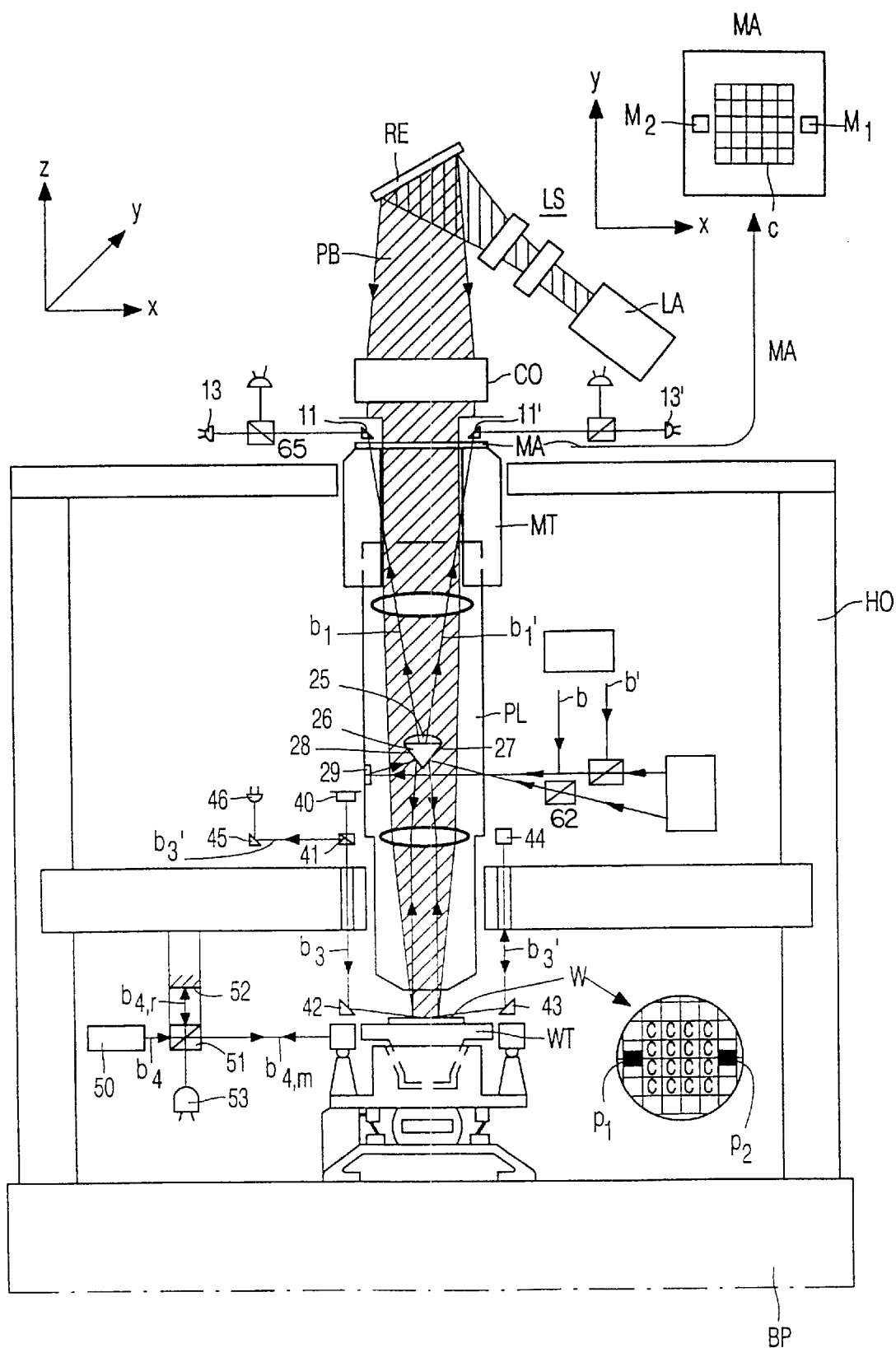
FIG. 5A is similar to FIG. 1 but also schematically shows an additional alignment device.

The effect of the correction lens can be elucidated with respect to FIG. 5 which shows the part of the radiation path between the correction lens and the substrate alignment mark $P_2$. The alignment beam b incident on the diffraction grating $P_2$ is split into a zero-order sub-beam b(0) which, upon perpendicular incidence of the beam b, has the same direction as the alignment beam, two sub-beams b(+1) and b(−1) of the first order and a number of pairs of sub-beams of the third, the fifth, etc. orders. These sub-beams are reflected towards the projection lens system. The first-order sub-beams reach the correction lens 25 located in the plane 24. This lens has such a power that it changes the directions of the first-order sub-beams in such a way that the chief rays of these beams intersect each other in the plane of the mask alignment mark $M_2$. The correction lens has such a small diameter that the higher-order sub-beams do not pass through this lens. An element preventing the zero-order sub-beam from passing through this lens is arranged proximate to the correction lens. In the embodiment of FIG. 5, this element is constituted by the reflecting prism 26 which is used for coupling the alignment beams b and b' into the projection lens system. This prism reflects the zero-order sub-beam in the direction of the incident alignment beam b. Due to said measures, it is achieved that only the first-order sub-beams are used for imaging the substrate alignment mark on the mask alignment mark, so that some additional advantages can be achieved.

The zero-order sub-beam does not comprise information about the position of the substrate alignment mark. Dependent on the geometry of the grating-shaped mark, notably the depth of the grating grooves and the ratio between the width of these grooves and the width of the grating intermediate strips, this beam may have a considerable intensity as compared with the intensity of the first-order sub-beams. By suppressing the zero-order sub-beam, the contrast in the image of the substrate mark may be enhanced considerably. When using the first-order sub-beams only, the second harmonic of the substrate alignment mark is, as it were, imaged, which means that the image of the mark, apart from the magnification M of the projection lens system, has a period which is half that of the mark itself. If it is ensured that the grating period of the mask alignment mark is equal to that of the image of the substrate alignment mark, i.e. equal to M/2 times the grating period of the substrate alignment mark, the accuracy with which a substrate alignment mark is aligned with respect to a mask alignment mark is twice as large as in the case where the full alignment beam is used for the imaging step.

The correction lens does not only ensure that the selected alignment beam portions are sharply focused on the mask plane, but, in principle, may also correct for an error of the magnification with which a substrate alignment mark is imaged on a mask alignment mark. Since the difference between the wavelengths of the projection beam and the alignment beam is larger than before, an extra lens 9, see FIG. 3, for correcting the residual magnification error is preferably arranged in the path of the alignment beam between the projection lens system PL and the mask alignment mark.

PCT patent application WO 97/35234, which relates to a special choice of the diffraction orders of the alignment beam so as to enhance the accuracy of the alignment device, describes several embodiments of the alignment device which are also applicable to the alignment device in accordance with the present invention. For example, a beam deflection element in the form of, for example a wedge may be arranged between the projection lens system PL and the mask plate MA, which element ensures that the axis of symmetry of the selected alignment beam portions is perpendicular to the mask plate. It is thereby prevented that, due to internal reflections in the mask plate, phase shifts having a detrimental influence on the alignment accuracy occur in the alignment beam.

The invention may not only be used in a device in which a substrate alignment mark is imaged on a mask alignment mark, but also in a device in which the reverse operation is carried out.

Moreover, the invention may be used in a device in which both a mask alignment mark and a substrate alignment mark are each imaged on a reference mark which is present outside the substrate and outside the mask.

This reference mark may be a physical mark, but also an artificial mark in the form of an interference pattern at the location of the substrate alignment mark and the mask alignment mark, which interference pattern is constituted by two interfering beams from the radiation source of the alignment device.

The accuracy with which a substrate alignment mark can be aligned with respect to a mask alignment mark may be enhanced considerably by modulating the output signals of the detectors 13 and 13' in FIGS. 1 and 3 at a fixed frequency. To this end, the mask MA and hence, for example the mask alignment mark $M_2$, can be moved periodically. However, an electro-optical modulation based on switching directions of polarization in combination with a displacement by means of a birefringent element is preferably used.

Principles relevant to the last-mentioned embodiments are described in the PCT application WO 97/35234 and are incorporated in the following paragraphs.

To prevent alignment errors when using a CMP-processed substrate, or errors caused by mask imperfections, and to enhance the alignment accuracy, the alignment radiation diffracted in the fourth order by the substrate alignment mark is used, according to the invention, for the detection. The principle of the novel alignment method is shown diagrammatically in FIG. 6. The beam b from the alignment radiation source reaches the substrate grating mark $P_2$ via a reflector 27. This grating splits the incident beam into a plurality of sub-beams of different diffraction orders, the fourth-order sub-beams of which are passed by a fourth-order diaphragm 55' to the mask alignment mark $M_2$. Of the fourth-order sub-beams, only two, b(+4) and b(−4), are shown in the form of their chief rays denoted by broken lines. The radiation incident on the grating mark $M_2$ is again split into a number of diffraction orders. Apart from the magnification of the projection lens system PL, the grating M has a period which is half that of the grating $P_2$. The portion of the sub-beam b(+4), hence the sub-beam with the double diffraction order b(+4,+2), diffracted in the +2 order by the grating $M_2$, and the portion of the sub-beam b(−4), hence the sub-beam with the double diffraction order b(−4,−2) diffracted in the −2 order by this grating coincide and their chief ray is perpendicular to the mark $M_2$. A detector 13 is arranged in the path of the double sub-beam whose chief ray is shown by way of broken lines again.

An order diaphragm 56, i.e. a zero-order diaphragm is preferably arranged between the mask mark $M_2$ and the detector 13 so that it is ensured that only the sub-beams b(+4,+2) and b(−4,−2) reach the detector. By using only the fourth-order sub-beams coming from the substrate in the device, it is simulated that use is made of a grating mark whose effective grating period is ⅛ of the physical period. Consequently, the resolving power of the grating measuring system, or in other words, the accuracy with which alignment errors can be detected, is raised by a factor of four as compared with an alignment system in which the beam portions diffracted in the first order by the substrate alignment mark are used. Due to the lower effective grating period, the influence on the alignment signal of the above-mentioned errors which are proportional to the grating period is reduced considerably.

Figure 6:
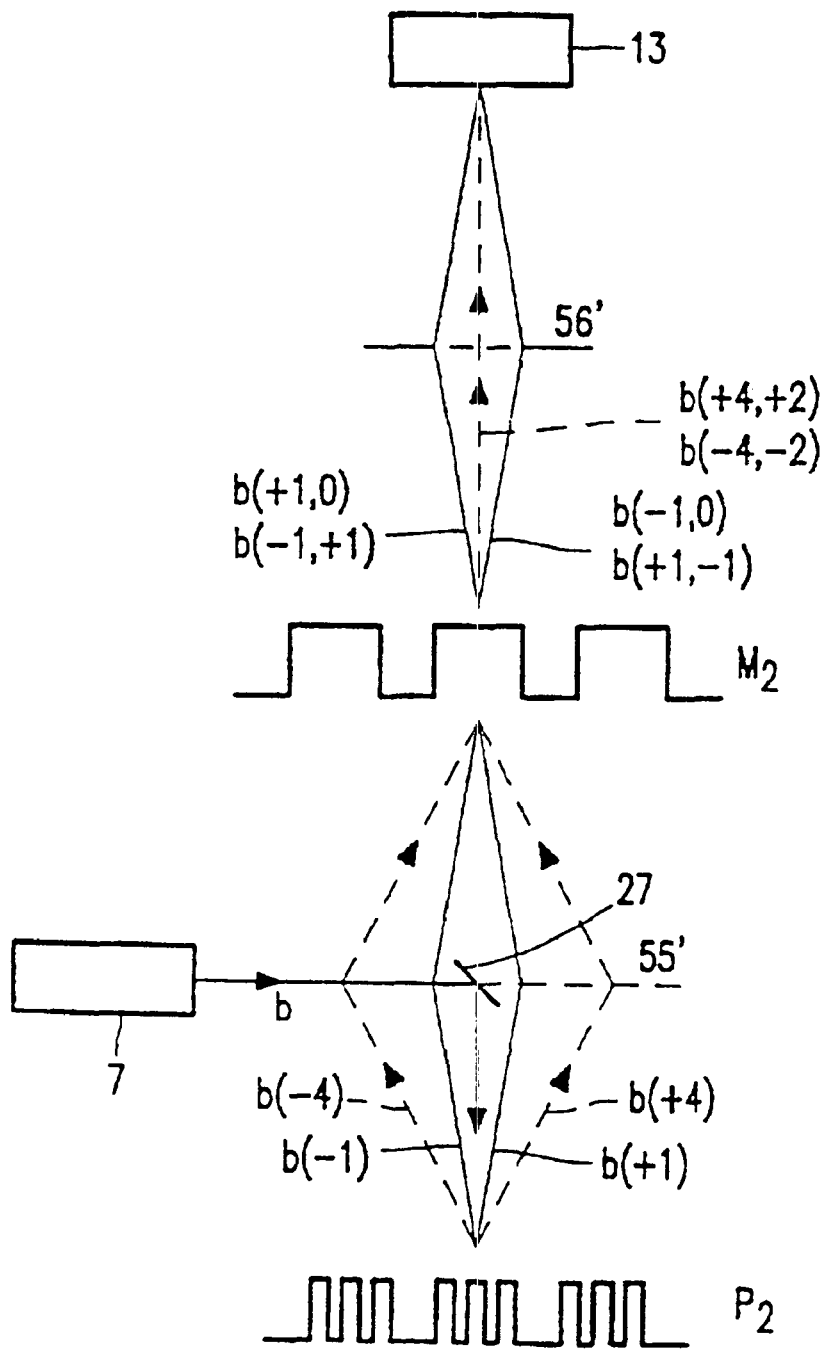
FIG. 6 shows a first selection of alignment beam portions.
Figure 7:
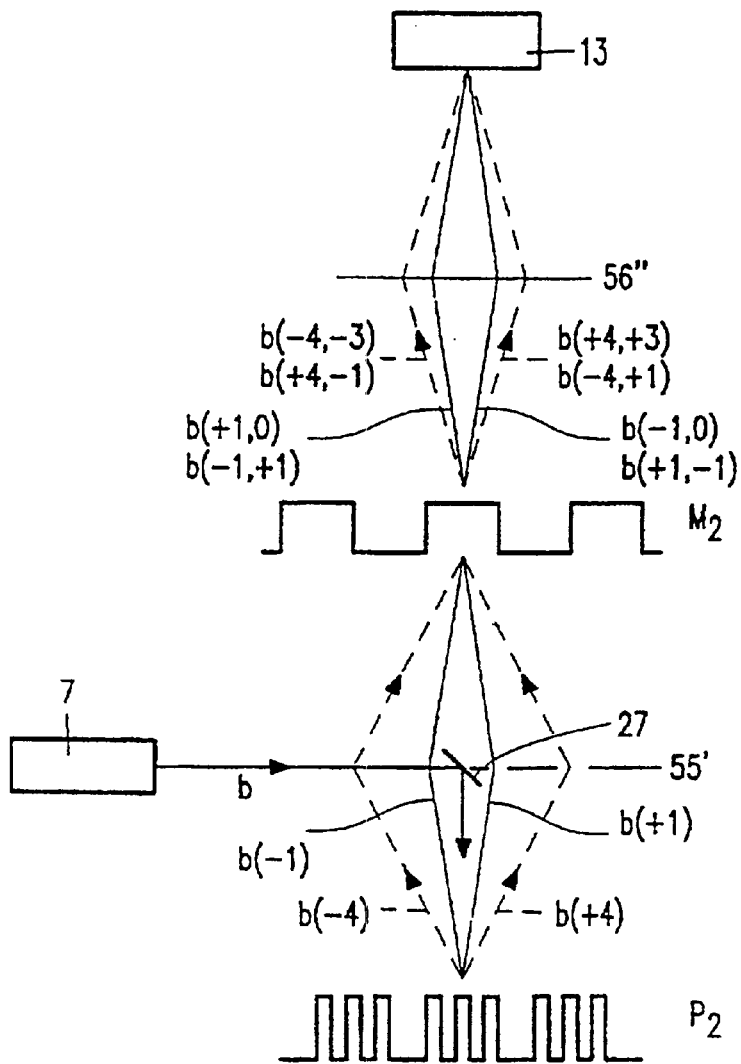
FIG. 7 shows a similar, second selection.

FIG. 7 shows another embodiment of the device according to the invention. Here again, a fourth-order diaphragm is arranged in the projection lens system. The order diaphragm 56" in the detection branch is now, however, implemented in such a way that the portions of the sub-beams b(+4) and b(−4) diffracted in the +1 order and −1 order and in the +3 order and −3 order by the mask alignment mark $M_2$ are passed. The double order sub-beams which are now passed are the coinciding pair b(+4,+3) and b(+4,+1), and the coinciding pair b(4,−3) and b(+4,−1). In the embodiment shown in FIG. 7, a larger portion of the alignment radiation diffracted in the fourth order by the substrate alignment mark is used than in the embodiment shown in FIG. 6. The order diaphragm 56' and the subsequent radiation in FIG. 6 path are, however, slightly simpler than in FIG. 7.

Instead of the sub-beams diffracted in the fourth order, also the sub-beams b(+2), b(−2) diffracted in the second order by the substrate alignment mark can be selected, in which case the fourth-order diaphragm 55' should be replaced by a second-order diaphragm. The portions of the sub-beams diffracted in the first order by the mask alignment mark. $M_2$, hence the double order sub-beams b(+2, +1) and b(−2,−1) then coincide again and can be selected with a zero-order diaphragm instead of with the diaphragm 56". It is alternatively possible to select the portions of the sub-beams b(+2) and b(−2) diffracted in the second order by the mask alignment mark, hence the double order sub-beams b(+2,+2) and b(−2,−2). When the sub-beams diffracted in the second order by the substrate alignment mark are used, the resolving power of the alignment device is smaller than when using the fourth-order sub-beams. The quantity of radiation energy in the second-order sub-beams may, however, be larger than that in the fourth-order sub-beams.

As already indicated in FIGS. 6 and 7, the advantages of the known alignment system can be maintained in the alignment device according to the invention by building in the possibility of generating an alignment signal by means of the sub-beams diffracted in the first orders by tree substrate alignment mark. The system which operates with the first-order sub-beams has a larger capture range, for example 40 μm for the grating marks with a period of 16 μm described with reference to FIG. 2. The order diaphragm 55' in FIGS. 6 and 7 should then be provided with extra apertures or radiation-transmissive areas passing the first-order sub-beams b(+1) and b(−1). Also the additional order diaphragm, 56' in FIG. 6 and 56" in FIG. 7, should then be provided with extra apertures which pass, for example, the coinciding double order sub-beams b(−1,0) and b(+1,−1) and the coinciding double order sub-beams b(+1,0) and b(−1, +1) coming from the mask alignment mark $M_2$.

Figure 8:
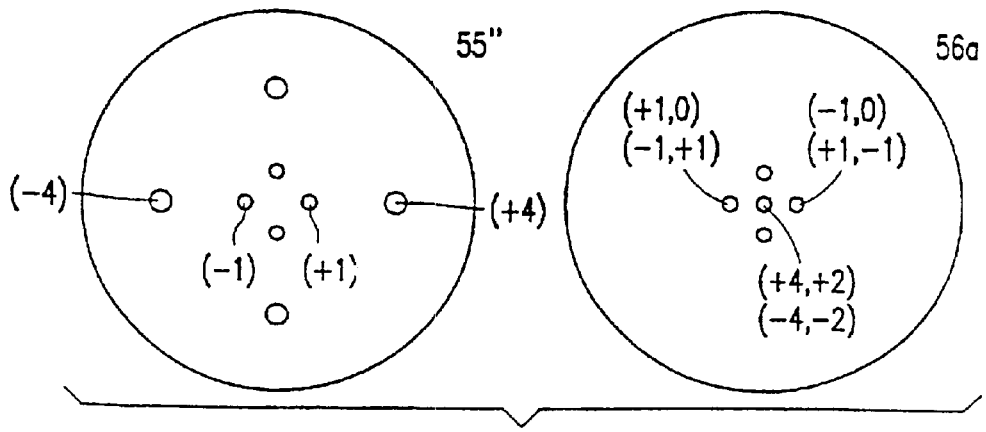
FIG. 8 is a plan view of a first embodiment of the order diaphragms with which such a selection is realized.

The left-hand part of FIG. 8 is a plan view of an order diaphragm 55" to be built into the projection lens system for selection of both the fourth-order and the first-order sub-beams of the substrate alignment mark, and the right-hand part shows a first embodiment of the associated additional diaphragm 56a. The diaphragm 56a corresponds to the diaphragm 56' of FIG. 6 but is provided with extra apertures for the sub-beams diffracted in the first orders by the substrate mark and in the zero order and the first orders by the mask mark. In FIG. 8, the apertures are shown by way of circles, while the passed single orders for the diaphragm 55" and the double orders for the diaphragm 56a are shown for the X direction. An analogous notation may be used for the Y direction.

Figure 9:
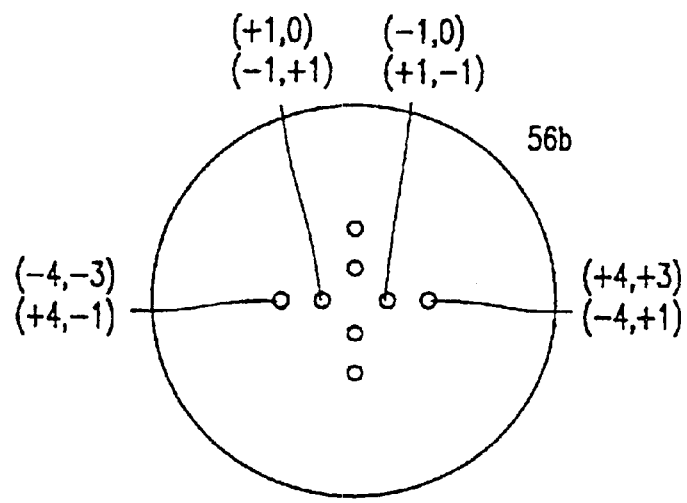
FIG. 9 shows a second embodiment of such an order diaphragm.

FIG. 9 shows an additional diaphragm 56b for use in the embodiment of FIG. 7 in which also the beam portions diffracted in the first orders by the substrate alignment mark are used. The associated diaphragm to be built into the projection lens system is identical to the diaphragm 55" in FIG. 8.

For the sake of completeness, it is to be noted that, for example (+4,+2) denotes the aperture passing a sub-beam diffracted in the +4 order by the substrate alignment mark and subsequently in the +2 order by the mask alignment mark.

In the projection apparatus provided with the alignment device according to the invention, correction elements are preferably arranged in the paths of the selected alignment beam portions. The reason for this and the functioning of these elements can best be elucidated with reference to the correction lens shown in FIG. 3, which lens is already present in the path of the first-order sub-beams in the known device.

Since the projection lens system PL is designed for the wavelength of the projection beam PB which, in connection with the desired large resolving power should be as small as possible, deviations may occur when this system PL is used for imaging the alignment marks $P_1$, $P_2$ and $M_1$, $M_2$ on each other by means of the alignment beam. For example, the substrate alignment marks $P_1$, $P_2$., will not be imaged in the plane of the mask pattern in which the mask alignment marks are located, but will be imaged it a given distance therefrom, this distance depending on the difference between the wavelengths of the projection beam and the alignment beam and on the difference between the refractive indices of the material of the projection lens elements for the two wavelengths. If the projection beam has a wavelength of, for example 248 nm and the alignment beam has a wavelength of 633 mm, this distance may be up to 2 m. Moreover, due to said wavelength difference, a substrate alignment mark is projected on a mask alignment mark with a magnification which deviates from the desired magnification while the deviation increases with an increasing wavelength difference.

To correct for said deviations, the projection lens system PL accommodates the correction lens 25 or another refracting or diffracting element. The correction lens is arranged at such a height in the projection column that, on the one hand, all first-order sub-beams coming from the substrate alignment mark can be influenced with this lens and, on the other hand, this lens has a negligible influence on the projection beam and the mask pattern image formed thereby.

Figure 10:
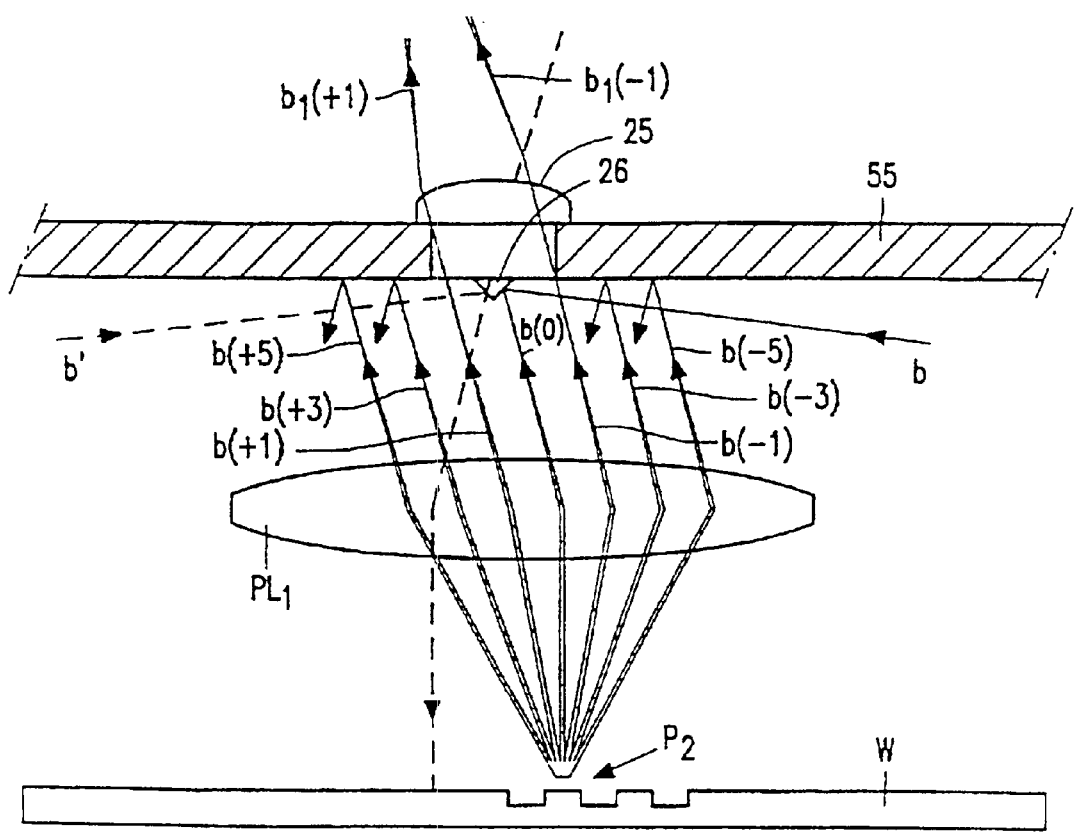
FIG. 10 shows the operation of a correction lens which may be used in the device.

The effect of the correction lens can be elucidated with reference to FIG. 10 which shows the part of the radiation path of the alignment beam portions between the correction lens and the substrate alignment mark $P_2$. The alignment beam b incident on the diffraction grating $P_2$ is split into a zero-order sub-beam b(0) which, upon perpendicular incidence of the beam b, has the same direction as the beam b, two sub-beams, b(+1) and b(−1) of the first order and a number of pairs of sub-beams of the third, the fifth, etc. orders These sub-beams are reflected towards the projection lens system. The first-order sub-beams reach the correction lens 25 located in the plane 24. This lens has such a power that it changes the directions of the first-order sub-beams b(−1) and b(+1) in such a way that the chief rays of these beams intersect each other in the plane of the mask alignment mark $M_2$. The correction lens has such a small diameter that the higher order sub-beams, which are deflected by the mark P through larger angles than the first-order sub-beams, do not pass through this lens. An element preventing the zero-order sub-beam b(0) from passing through the correction lens is arranged proximate to the correction lens. In the embodiment of FIG. 10, this element is constituted by the reflecting prism 26 which is used for coupling the alignment beams b and b' into the projection lens system. This prism reflects the zero-order sub-beam in the direction of the incident alignment beam b. Due to said measures, it is achieved that only the first-order sub-beams are used for imaging the alignment grating $P_2$ on the alignment grating $M_2$, so that some additional advantages can be achieved.

The zero-order sub-beam does not comprise information about the position of the alignment grating $P_2$. Dependent on the geometry of the grating, notably the depth of the grating grooves and the ratio between the width of these grooves and the width of the grating intermediate strips, this beam may have a considerable intensity as compared with the intensity of the first-order sub-beams. By suppressing the zero-order sub-beam, the contrast in the image of $P_2$ may be enhanced considerably. When using the first-order sub-beams only, the second harmonic of the grating $P_2$ is, as it were, imaged, in other words, apart from the magnification M of the projection lens system PL, the image of $P_2$ has a period which is half that of the grating $P_2$. If it is ensured that the grating period of the grating $M_2$ is equal to that of the image of $P_2$, i.e., equal to M/2 times the grating period of the grating $P_2$, the accuracy with which the gratings M and P are aligned is twice as large as in the case where the full beam b is used for the projection.

Under circumstances, particularly at a smaller difference between the wavelengths of the projection beam PB and an alignment beam b, b', and when using achromatic lens elements in the projection lens system, it may occur that sub-beams having diffraction orders of more than one still reach the mask alignment mark $M_2$ via the projection lens system. To prevent this, the first-order diaphragm plate 55 is arranged in the plane of, or proximate to, the correction lens 25. The material of the plate may be dichroic and transparent to the projection beam, but opaque to the alignment radiation. Then, areas which block the alignment radiation are present at those positions where parts of the alignment beam with diffraction orders higher than one reach the plate. These areas are small and jointly cover only 5 to 10% of the pupil surface area of the projection lens system, so that they have a negligible influence on the projection beam.

The correction lens 25 does not only ensure that an alignment sub-beam is sharply focused on the mask plane, but may also correct for an error in the magnification with which a substrate alignment mark is imaged on a mask alignment mark, which magnification error results from the fact that the projection lens system is designed for the wavelength of the projection beam instead of for that of the alignment beam. This magnification error correction will be sufficient in many cases. In an apparatus in which a deep ultraviolet beam having a wavelength of, for example 248 nm is used as a projection beam, it may occur that the correction lens 25 cannot completely correct the magnification error. In that case, an extra lens, 9 in FIG. 3, may be arranged in the path of the alignment beam between the projection lens system PL and the mask alignment mark so as to eliminate the residual magnification error.

In the alignment device according to the invention, in which sub-beams diffracted by the substrate alignment mark in one of the even orders are used, these sub-beams can no longer be corrected with one correction element because, due to the deflection angle increasing with an increasing diffraction order number, the different sub-beams of the selected order are so far apart that a lens receiving all these beams covers too large a part of the projection beam. For this reason, a number of correction elements equal to the number of sub-beams of the selected order are used in the device according to the invention, i.e. four correction elements in the case of two-dimensional alignment marks. These correction elements may be arranged proximate to the radiation-transmissive areas of the order diaphragm, or in the apertures of this diaphragm.

FIG. 11 shows an embodiment of a diaphragm plate 110 with such correction elements for use in an alignment device in which the fourth-order sub-beams are selected. These correction elements, in the form of small lenses 111–114, for the sub-beams b(+4)x, b(−4)x, b(+4)y and b(−4)y for the beam portions diffracted in the plus and minus fourth order in the X and Y directions cover the apertures in the diaphragm plate 110. As is also shown in FIG. 11, the plate 110 may also comprise a central lens 115 which is larger than the lenses 111–114, which lens has the same function as the lens 25 in FIG. 3 if also the first-order diffracted sub-beams are used. Just like the correction lens 25, the correction lenses 111–115 may be replaced by other refractive elements, such as double wedges, or by diffractive elements.

The substrate alignment mark shown in FIG. 2 is not optimized for generating fourth-order sub-beams. A further aspect of the present invention therefore relates to the optimization of the grating geometry. FIGS. 13, 14 and 15 show small parts of different suitable grating geometries, while for comparison, FIG. 12 shows a part of the grating structure according to FIG. 2. In the latter structure, 120, the grating grooves 121 are as wide as the intermediate strips 122, thus both are 8 $\mu$m if the structure has a period p=16 $\mu$m.

FIG. 13 shows a special grating structure 125 for generating fourth-order sub-beams. The grating grooves 126 have a width which is equal to ¼ of that of the grooves 121 of FIG. 12, i.e. 2 $\mu$m in the example and thus only ⅛ of the grating period p.

To intensify the alignment signal generated by means of the fourth-order sub-beams, the grating structure 130 of FIG. 14 is preferably used. Here, four grating grooves 131 are present per grating period, each being 2 $\mu$m wide in the relevant example. An intermediate strip 132 having a width which is twice that of the grating grooves is present between the second and the third groove in each period, while the width of the intermediate strips 133 between the first and the second grating groove and that between the third and the fourth grating groove is equal to the width of the grating groove.

If a given amount of radiation in the first orders is desirable in addition to a given amount of radiation in the fourth orders, it is possible to choose the grating structure 135 of FIG. 15 in which two grating grooves 136 are present per grating period and the width of the intermediate strip 137 is equal to five times the width of these grooves.

All the substrate marks shown in FIGS. 13, 14 and 15 are projected on a mask alignment mark which, apart from the magnification of the projection lens system, has a period which is equal to half that of the mark according to FIG. 12, but a geometry which is equal to that of this mark.

It is to be noted that the values for the grating period and groove width given above are only examples This period and width may alternatively be larger or smaller, with said ratio between groove width and period and the number of grooves per period being maintained.

Figure 16:
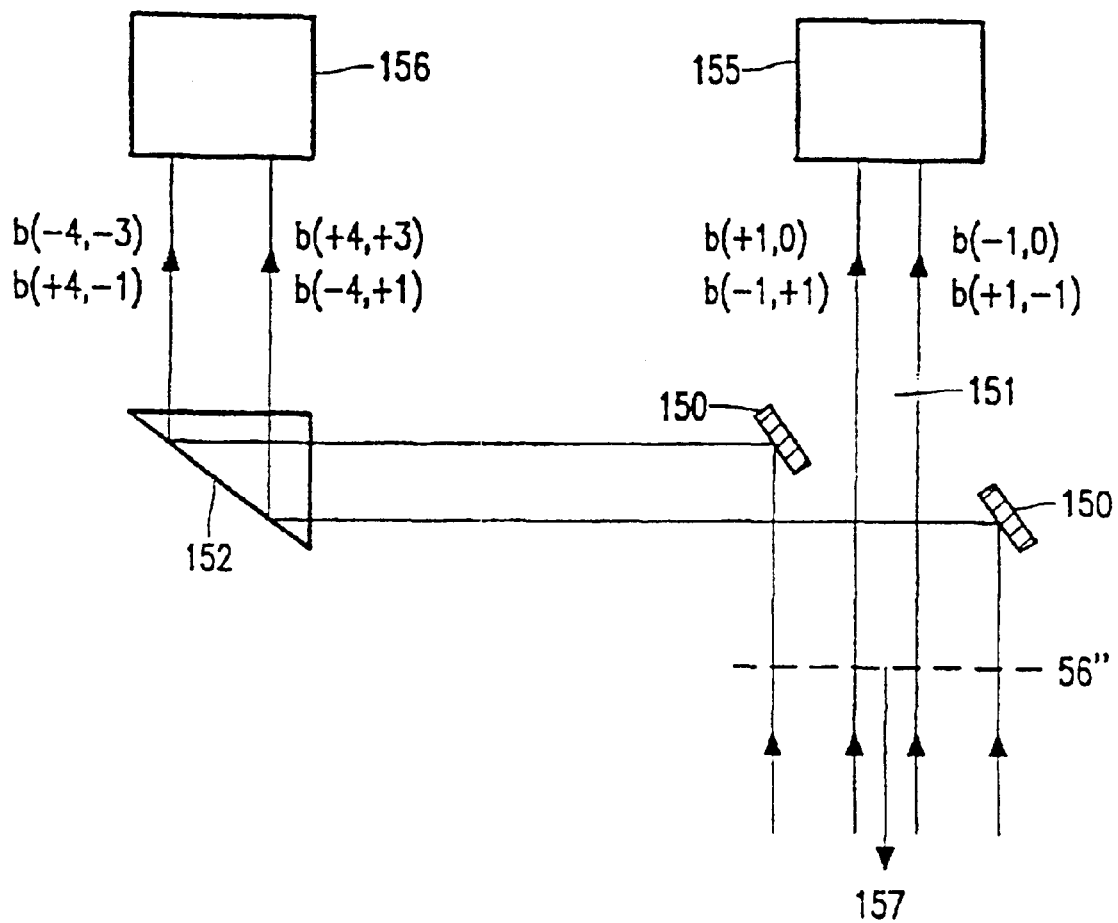
FIG. 16 shows an embodiment of a beam separator arranged behind the second alignment mark for separating the fourth-order sub-beams from the first-order sub-beams.

FIG. 16 shows how the sub-beams diffracted in the fourth order by the substrate alignment mark can be separated in the detection branch from the sub-beams diffracted in the first order by said mark. To this end, for example, the combined path of these sub-beams incorporates a reflector 150 which is provided with a central aperture 151. The first-order sub-beams b(+1,0), b(−1, +1) and b(−1,0), b(+1,−1) are passed through this aperture to their own detector 155.

The fourth order sub-beams b(−4,−3), b(+4,−1) and b(+4, +3), b(−4, +1) are reflected by the reflector 150 and reach their detector 156 via a reflecting prism 152. The arrow 157 symbolically shows the orders blocked by the order diaphragm 56''.

Figure 17:
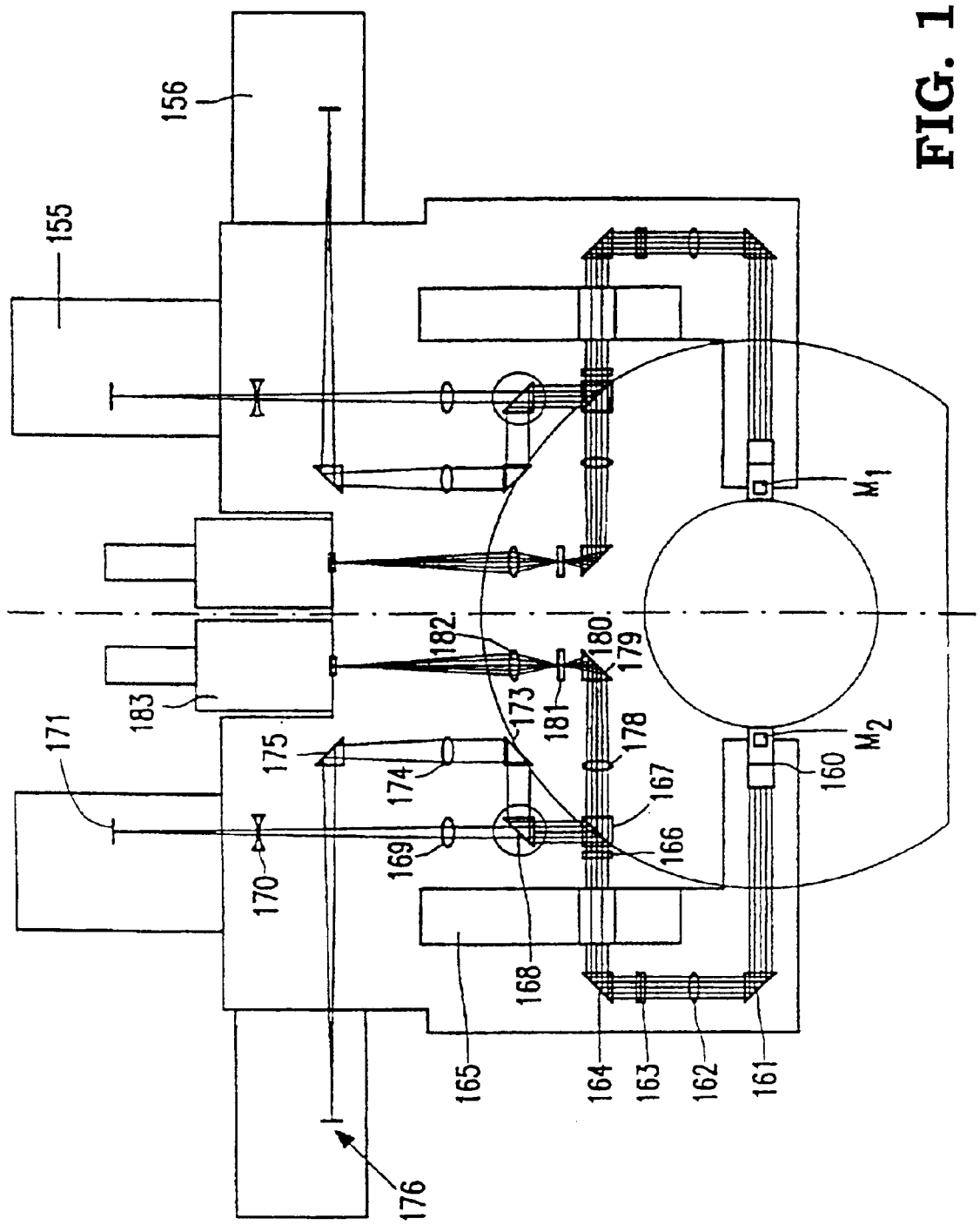
FIG. 17 shows a detailed embodiment of the radiation path between the second alignment mark and the detection system.

FIG. 17 shows a more detailed embodiment of the detection branch of a projection apparatus provided with a double alignment device. The references $M_1$ and $M_2$ denote the mask alignment marks. The left and right alignment devices have an identical structure, so that it is sufficient to describe the left-hand part of FIG. 17 only. The radiation coming from the mask mark $M_2$ is coupled into the detection branch by a prism system 160 and is then reflected successively by the prisms 161 and 164 to a beam splitter 167. A lens 162 and a correction plate 163 are arranged between the prisms 161 and 164. An optical modulator 165 and a polarization analyser 166 are arranged in front of the beam splitter. The radiation reflected by the beam splitter 167 is incident on a reflector 168 having a central aperture analogous to that of the reflector 150 in FIG. 16. The reflector 168 transmits the first-order sub-beams to a detector 171, which beams pass the lenses 169 and 170. The fourth-order sub-beams are reflected by the reflector 168 and reach the detector 176 via further reflections on the prisms 173 and 175. A further lens 174 is arranged between the prisms 173 and 175. The radiation passed by the beam splitter 167 may be guided to a camera 183 via a prism 180 and a lens 182, so that the alignment is also rendered visible to the operator of the apparatus.

As is shown in FIGS. 1 and 3, the chief rays of the beams b, and $b'_1$, which chief rays can be considered to be the axes of symmetry of the sub-beams formed by the substrate alignment marks $P_2$ and $P_1$ traverse the mask plate MA obliquely. A part of this mask plate at the location of the alignment mark $M_1$ in the form of a grating is shown on a larger scale in FIG. 18. This Figure also shows the chief rays $b'_1(+1)$ and $b'_1(-1)$ which are formed by the substrate alignment mark (not shown). The reference SA denotes the axis of symmetry of the sub-beams $b'_1(+1)$ and $b'_1(-1)$. and the direction of this axis coincides, for example, with that of the zero-order sub-beam $b'_1(0)$ which is blocked and does not reach the mark $M_1$. The sub-beams $b'_3(+1,0)$ and $b'_1(+1,-1)$ formed by the grating mark $M_1$ from the sub-beam $b'_1(+1)$ and the sub-beams $b'_1(-1,0)$ and $b'_1(-1,+1)$ formed from the sub-beam $b'_1(-1)$ are captured by the detection system (not shown). The sub-beams having other double diffraction orders may be either blocked or diffracted at such angles that they do not reach the detection system.

Figure 18:
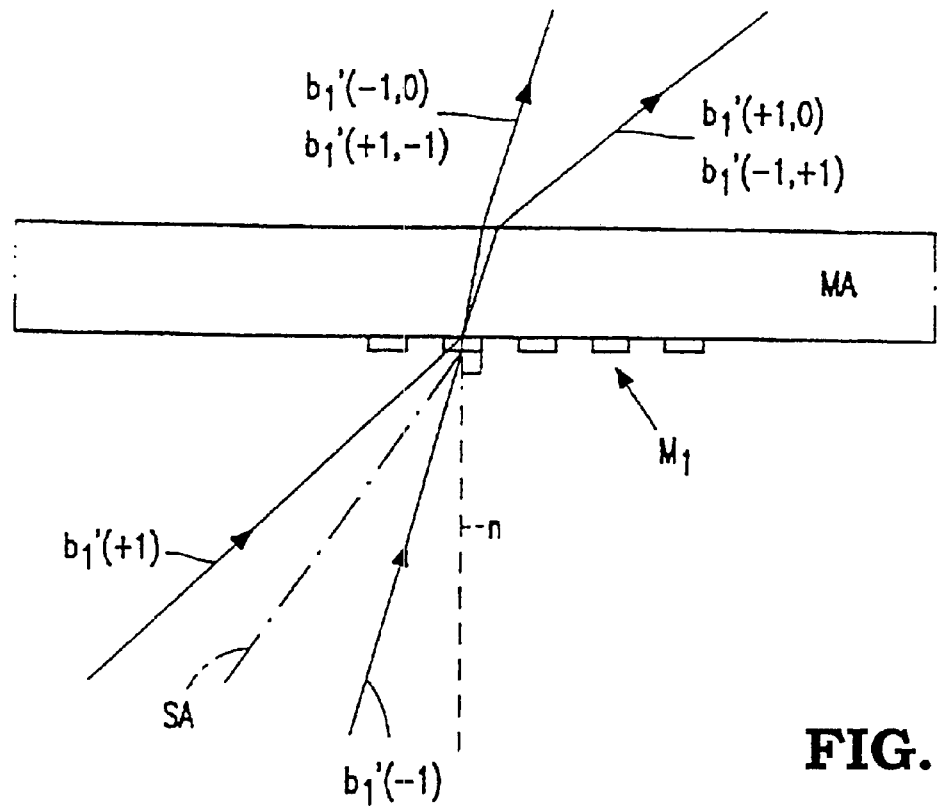
FIG. 18 shows the path of the alignment radiation through the mask plate.
Figure 19:
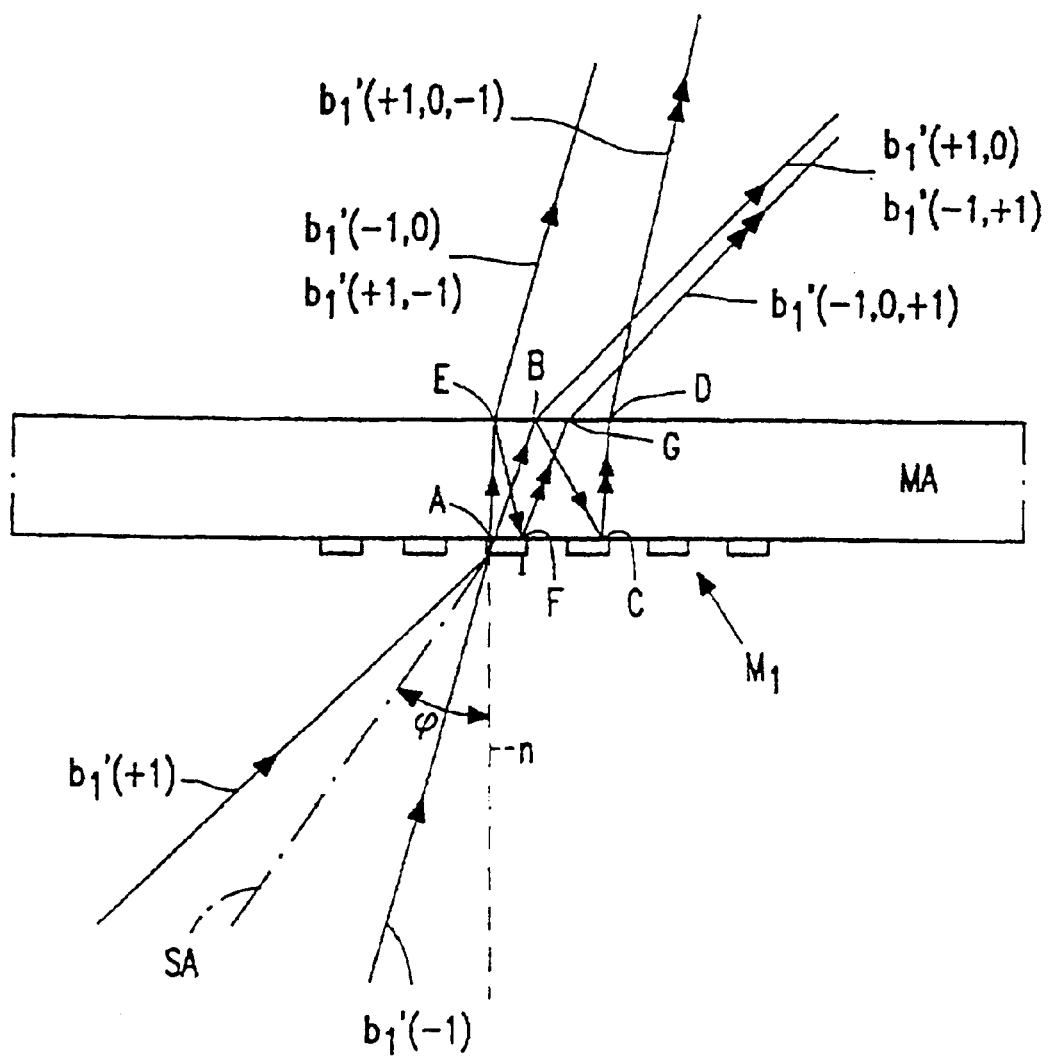
FIG. 19 shows this path when reflections occur on this plate.

As long as only the sub-beams $b'(-1,0)$, $b'_1(+1,-1)$, $b'_1(+1,0)$ and $b'_1(1,+1)$ shown in FIG. 18 interfere with each other at the location of the detection system, the oblique position of the symmetry axis does not result in an alignment error. However, as the Applicant has discovered and as is shown in FIG. 19, a portion of the double order sub-beam $b'_1(+1,0)$ may be reflected by the upper side of the mask plate MA so that it is once more incident on the grating mark $M_1$. The three-fold order sub-beam $b'_1(+1,0,-1)$ is then formed by this grating, which sub-beam has the same direction as the double order sub-beams $b'_1(-1,0)$ and $b'_1(+1,-1)$. A portion of the double order sub-beam $b'_1(-1,0)$ may also be reflected by the upper side of the mask plate so that it is once more incident on the grating mark $M_1$. This produces a three-fold order sub-beam $b'_1(-1,0, +1)$ which has the same direction as the double order sub-beams $b'_1(+1,0)$ and $b'_1(-1,+1)$.

Although the mark $M_1$ may also supply 3rd-order, 5th-order and higher order beams and also higher order reflections may occur in the mask plate, it is sufficient and better for the purpose of comprehension to discuss the two-fold and three-fold first-order diffracted sub-beams only.

The sub-beam $b'_1(+1,0,-1)$ has covered the path A, B, C, D in the mask plate MA and the sub-beam $b'_1(1,0, +1)$ has covered the path A, E, F, G which is shorter than the path A, B, C, D. Consequently, there is a phase difference among the three-fold order sub-beams $b,'_1(+1,0,-1)$ and $b'_1(-1,0, +1)$ and between these sub-beams and the corresponding double order sub-beams. As a result of this phase difference, which is mainly dependent on the thickness of the mask plate and the angle 0 between the axis of symmetry SA and the normal n on the mask plate, the interference pattern is displaced with respect to the detection system, which displacement is independent of alignment errors. As a result of this displacement, an offset occurs in the alignment signal and in the realized alignment of the mask with respect to the substrate, and the magnitude of this offset is dependent on the reflection coefficient and the thickness of the mask plate. For one projection apparatus, in which different masks are used, this offset may be different for the different masks, while for one mask, which is consecutively used in different projection apparatuses, the offset in the different apparatuses may be different because the angle Φ may be different.

Said offset is relatively large when using coherent alignment radiation a; is supplied by a gas laser, but may also occur, though to a lesser extent, when using less coherent or non-coherent alignment radiation as supplied by excimer lasers, semiconductor lasers or mercury lamps.

To eliminate said alignment error, a beam deflection element may be arranged between the projection lens system PL and the mask plate MA, which element ensures that the axis of symmetry of the sub-beams used is perpendicular to the mask plate, or in other words, the chief rays of these equal but opposite diffraction orders sub-beams are incident on the mask plate at equal but opposite angles.

Figure 20:
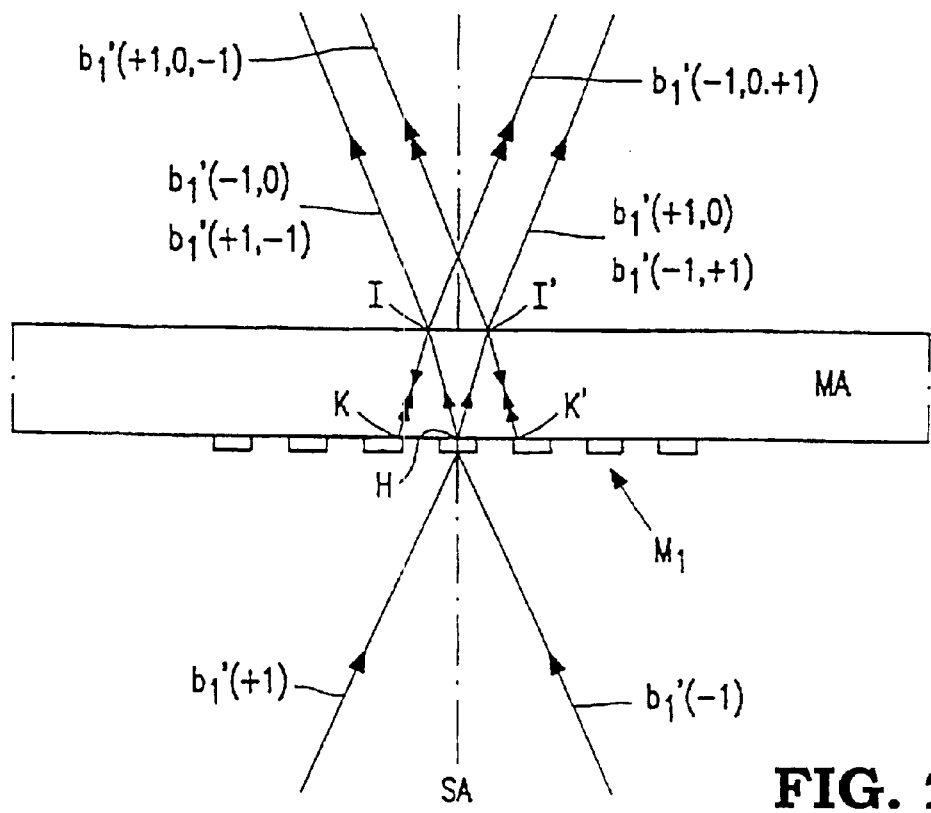
FIG. 20 shows the path of the alignment radiation through the mask plate in a device with a radiation deflection element.

FIG. 20 shows the situation in which the first-order sub-beams $b'_1(-1)$ and $b'_1(+1)$, which originate from the substrate alignment mark Pi, are symmetrically incident on the mask alignment mark $M_1$. The portion of the sub-beams $b'_1(-1,0)$ which is reflected by the upper side of the mask plate and is reflected as a three-fold order sub-beam $b'_1(1,0, +1)$ by the grating $M_1$ traverses the path HIK through the mask plate, which path is equally long as the path HI'K' traversed by the three-fold order sub-beam $b'_1(+1,0,-1)$, which sub-beam is formed from the part of the sub-beam $b'_1(+1,0)$ reflected by the upper side of the mask plate. Then there is no longer any phase difference between the three-fold order sub-beams and the corresponding two-fold order sub-beams, whereby the cause of the alignment error described hereinbefore is eliminated.

Figure 21:
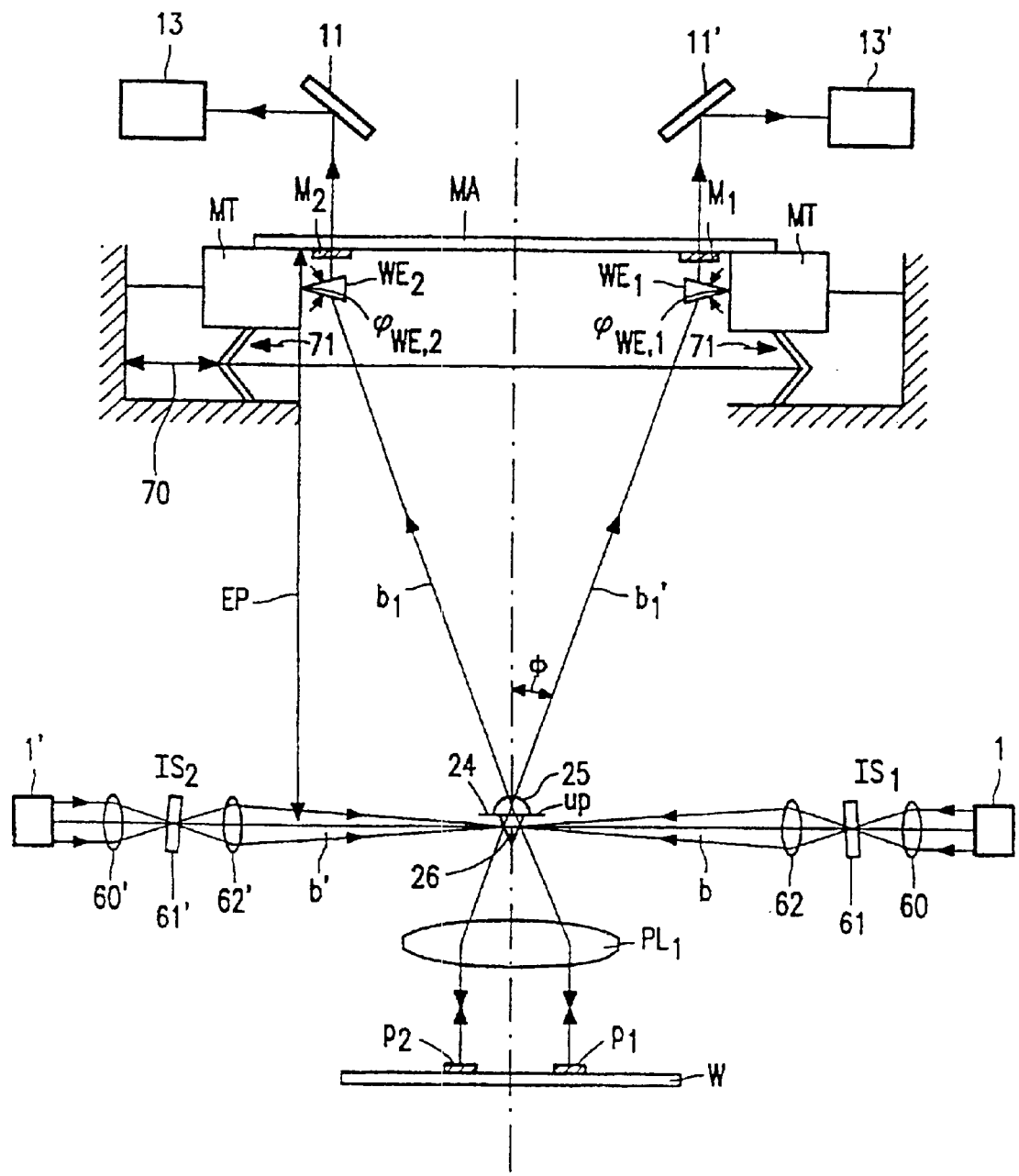
FIG. 21 shows an embodiment of such a device.

FIG. 21 shows an embodiment of a double alignment device in which the extra deflection elements are used. Wedge-shaped elements $WE_1$ and $WE_2$ are arranged under the mask alignment marks $M_1$ and $M_2$, which elements deflect the chief rays of the alignment beams $b'_1$ and $b_1$ from the substrate alignment marks $P_1$ and $P_2$ in such a way that these chief rays are perpendicular to the mask plate MA. The alignment beams traverse the marks $M_1$ and $M_2$ in known manner and are subsequently directed towards the detection systems; 13' and 13 by the reflectors 11' and 11. The mask and the substrate can be aligned with respect to each other by means of the output signals of these systems, for example, by displacing the mask table MT, as is symbolically indicated by means of the double-headed arrow 70 and the parallelogram construction 71 described in U.S. Pat. No. 4,698,575.

In the embodiment of FIG. 21 the alignment beams b and b' coming from two separate illumination systems $IS_1$ and $IS_2$ each comprising a radiation source 1 (1'), two lenses 60, 62 (60', 62') and an adjustable plane-parallel plate 61 (61') with which a precision adjustment of the direction of the beam b (b') can be realized. The lenses 60 and 62 ensure that the quality of the image of the source 1 (1') is maintained. The beams b and b' are reflected towards the substrate alignment marks $P_1$ and $P_2$ by a reflecting prism 26 which is present within the projection lens system. For the sake of simplicity, only the lens group under the Fourier plane is diagrammatically illustrated by means of one lens element $PL_1$ in this projection lens system.

The beam-coupling prism 26 is preferably present at the height of the Fourier plane of the projection lens System. The angle $\Phi$ which must he corrected by the wedge is defined by:

$$\tan\Phi = \frac{M_1 - M_2}{2EP}$$

in which $M_1-M_2$ is the distance between the mask marks $M_1$ and $M_2$ and EP is the distance between the mask plate MA and the exit pupil UP of the projection lens system at the side of the mask. In one embodiment of the projection apparatus, in which the distance between the marks $M_1$ and $M_2$ is 96 mm and the distance EP is 400 mm, the angle $\Phi$ to be corrected is 120 mrad. This requires a wedge having a wedge angle $\Phi_{WE}$ of only 240 mrad. Such a wedge may consist of a small piece of glass having a thickness of only 2 mm. It is not necessary to impose strict requirements of mechanical and thermal stability on such a wedge.

In the axial direction the wedge must be positioned in a stable manner with respect to the mask plate with an accuracy of $$\frac{M \cdot \Delta a}{\varphi} \frac{\text{nm}}{\text{mrad}}.$$

Here M is the magnification of the projection lens system and $\Delta a$ is the still admissible alignment error at the area of the substrate. In one embodiment with $M=5$, $\Delta a=5$ nm and $\Phi=120$ mrad the value of $$\frac{M \cdot \Delta a}{\varphi} = 120\,\text{nm}.$$

It has been found that with such a wedge the measurement and control of the magnification error which, as described in U.S. Pat. No. 4,778,275 can be carried out with the aid of the substrate marks $P_1$ and $P_2$ and the mask marks $M_1$ and $M_2$, still functions satisfactorily, provided that the distance between the mask marks $M_1$ and $M_2$ is considerably shorter than the distance EP in FIG. 21.

Instead of a wedge, a different element such as, for example, a mirror or a lens may be used to correct the directions of the selected order sub-beams.

The invention may not only be used in an apparatus having a double alignment device and a refractive correction element 25, but also in a double alignment device without this element, such as the device described in U.S. Pat. No. 4,778,275. The invention may be further used in a single alignment device including a correction element 25 or without this element, such as the device described in U.S. Pat. 4,251,160.

Figure 22:
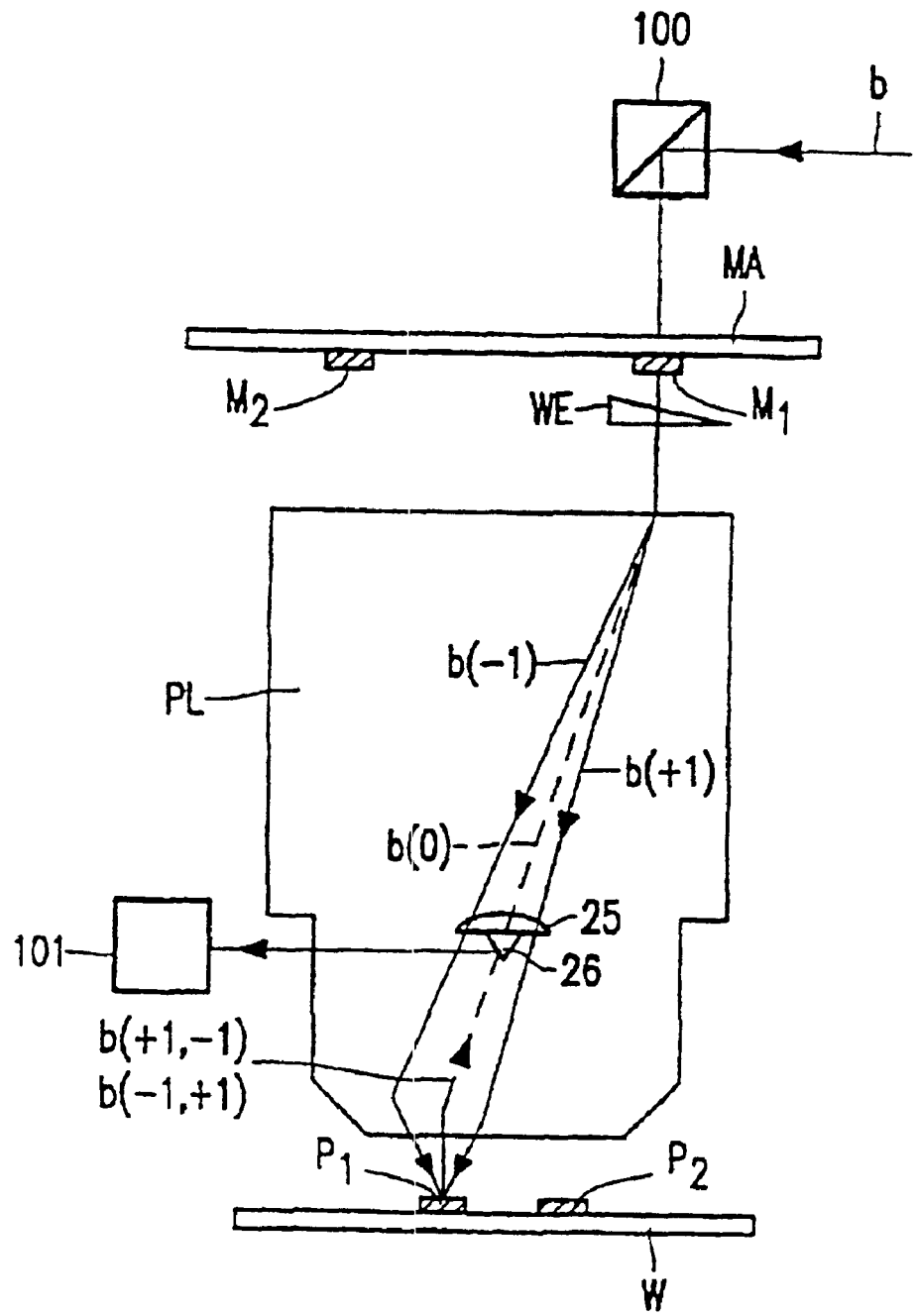
FIG. 22 shows a second embodiment of an alignment device.

FIG. 22 shows an embodiment of the alignment device in which a mask alignment mark, $M_1$ or $M_2$, or a substrate alignment mark, $P_1$ or $P_2$, is imaged by the projection lens system and with the aid of diffracted order sub-beams which are formed by the mask alignment mark from the entering beam b. As in the other embodiments, these sub-beams traverse the projection lens obliquely. In order to cause the beam b to be incident perpendicularly to the mask plate MA via the prism 100 under this condition, so that extra reflections on this plate do not have any influence on the alignment signal obtained, a wedge-shaped or other deflection element WE is arranged below the mask plate. The portions of the sub-beams which are reflected by the substrate alignment mark $P_1$ and diffracted, i.e., the two-fold order sub-beams, comprising information about the mutual position of the marks $M_1$ and $P_1$, are reflected to the detection system 101 by the reflector 26.

The alignment device according to FIG. 22 and may alternatively be doubled.

Generally, a double alignment system is preferred because the relative angle orientation of the mask pattern and the substrate is directly laid down optically, while magnification errors of the projection lens system as well as deformations in the substrate and the mask can be measured.

The accuracy with which the substrate alignment marks can be aligned with respect to the mask alignment marks is considerably enhanced by modulating the output signals of the detectors, for example, 13 and 13' in FIGS. 1, 3 and 29, with a fixed frequency. To this end the mask M and hence, for example, the mask mark $M_2$ can be periodically moved, as has been described in the article in "SPIE", Vol. 470 "Optical Microlithography" III "Technology for the next Decade" 1984, pp. 62–69. A better alternative for obtaining a dynamic alignment signal, described in U.S. Pat. No. 4,251,160, with which the accuracy of the alignment device according to the invention can also be enhanced is shown in FIG. 3.

Before reaching the mark $M_2$, the beam $b_1$ has traversed the polarization-sensitive splitting prism 2 so that this beam is linearly polarized and has a given direction of polarization. Subsequently, the beam $b_1$ traverses a plate 8 of birefringent material, for example, quartz whose optical axis extends at an angle of 45° to the direction of polarization of the beam leaving the prism 2. The element 8 may also be a Savart plate or a Wollaston prism. Two mutually perpendicularly polarized beams leave the plate 8, which beams are shifted with respect to each other at the location of the mask mark M, along a given distance which is determined by the geometry of the mark $M_2$. When using gratings as alignment marks, said distance is equal to half the grating period of the grating $M_2$. A polarization modulator 18 and a polarization analyser 19 are arranged in front of tie detector 13. The modulator 18, for example, an elasto-optical modulator is controlled by a voltage $V_B$ which is supplied by a generator 20. The direction of polarization of the beam passing through the modulator is thereby switched alternately through 90°. The analyser 19 has the same main direction, or pass direction, as the polarization-sensitive splitting prism 2 so that alternately a first radiation beam having a first direction of polarization, which beam has formed, for example, a non-shifted image of $P_2$ on $M_2$, and a second radiation beam having a second direction of polarization, which beam has formed, for example, an image of $P_2$ on $M_2$ shifted through half a grating period, are passed to the detector 13. The signal of the detector 13 is amplified and processed in a phase-sensitive detection circuit 21 to which also the signal $V_B$ is applied. The output signal $S_A$ is the desired dynamic alignment signal.

The modulator 18 and analyser 19 may alternatively be arranged in the radiation path in front of the mask alignment mark.

In the alignment device, in which, for example, both the fourth-order sub-beams and the first-order sub-beams are used, the thickness of the plate will have to be optimized so that it is usable for both orders, the sub-beams of which traverse said plate at different angles.

The invention has been elucidated with reference to an optical lithographic apparatus, but it is not limited thereto. The invention may also be used in a lithographic apparatus in which the projection beam is a charged-particle beam such as an electron beam, an ion beam or an X-ray beam. These lithographic apparatuses may not only be used for manufacturing integrated circuits but also for manufacturing, for example liquid crystalline display panels, magnetic heads, or integrated planar optical systems.

What is claimed is:

1. A lithographic apparatus constructed and arranged to image a mask pattern, present in a mask provided with at least a first alignment mark, on a substrate provided with at least a second alignment mark, said lithographic apparatus comprising:

an illumination unit constructed and arranged to illuminate the mask pattern with a projection beam;

a mask holder constructed and arranged to hold the mask;

a substrate holder constructed and arranged to hold the substrate;

a projection system arranged between the mask plate holder and the substrate holder, said projection system projecting the mask pattern on the substrate; and an alignment device constructed and arranged to align the mask plate and the substrate with respect to each other said alignment device comprising:

a radiation source constructed and arranged to supply an alignment beam irradiating one of said first and second alignment marks, an alignment imaging system arranged between said first alignment mark and said second alignment mark, said alignment imaging system imaging one of said first and second alignment marks onto the other alignment mark by the alignment beam for alignment control, and a detection system sensitive to the alignment beam radiation and arranged in the path of alignment beam radiation coming from said other alignment mark, said detection system converting alignment radiation into an electrical output signal, wherein the first and second alignment marks are periodic structures which deflect the alignment beam into several diffraction orders of sub-beams, the second alignment mark having a depth profile, the detection system detecting only selected sub-beams and the output signal of the detection system being indicative of the extent to which the first and second objects are aligned with respect to each other, and wherein the wavelength of the alignment beam is of the order of 1000 nm and at most 100 nm.

2. A lithographic apparatus as claimed in claim 1, wherein the radiation source is a laser selected from the group of lasers consisting of an Nd:YAG laser having a wavelength of 1064 nm;

an Nd:YLF laser having a wavelength of 1047 nm; and a semiconductor laser having a wavelength of 980 nm.

3. A lithographic apparatus as claimed in claim 1, wherein the detection system comprises an InGaAs detector.

4. A lithographic apparatus as claimed in claim 1, wherein the projection beam is a beam of electromagnetic radiation, the projection system is an optical projection system, and the imaging system of the alignment device also comprises the optical projection system.

5. A lithographic apparatus as claimed in claim 1, wherein a radiation deflection element is arranged in the vicinity of a mask alignment mark constructed and arranged to direct the axis of symmetry of selected alignment beam portions principally perpendicularly to the plane of the mask plate, said radiation deflection element being considerably smaller than the cross-section of the projection beam at the position of said plate.

6. A lithographic apparatus as claimed in claim 1, wherein said first alignment mark is a substrate alignment mark and said second alignment mark is a mask alignment mark.

7. A lithographic apparatus as claimed in claim 1, wherein said first alignment mark is a mask alignment mark and said second alignment mark is a substrate alignment mark.

8. A lithographic apparatus as claimed in claim 1, wherein the second alignment mark is a reference alignment mark which is located outside the substrate and outside the mask, and both a substrate alignment mark and a mask alignment mark constitute first alignment marks which are each imaged onto the reference alignment mark.

9. A lithographic apparatus as claimed in claim 1, wherein the radiation source of the alignment device supplies two radiation beams which form an interference pattern in the plane of a substrate alignment mark and in the plane of a mask alignment mark, the first alignment mark is constituted by the interference pattern, and both the substrate alignment mark and die mask alignment mask are second alignment marks.

10. A lithographic apparatus as claimed in claim 1, further comprising a displacing unit controlled by periodical signals arranged in a radiation path of an alignment beam, said displacing unit periodically displacing with respect to each other a second alignment mark and the image on said second alignment mark of a first alignment mark observed by the detection system.

11. A lithographic apparatus of claim 1, wherein one of said alignment marks is reflective to a portion of the alignment beam and a correction element, constructed and arranged to correct the direction and convergence of said reflected alignment beam portion, is arranged between the substrate holder and the mask holder, in said alignment beam portion, said correction element having a dimension which is considerably smaller than the diameter of said alignment beam portion on the plane of said correction element.

12. A lithographic apparatus as claimed in claim 1, wherein an order diaphragm, provided with radiation-transmissive portions which transmit only alignment beam portions to a second alignment mark diffracted by a first alignment mark in the first order, is provided in the alignment beam between the mask holder and the substrate holder.

13. A lithographic apparatus as claimed in claim 1, wherein, in addition to said alignment device, an additional alignment device is provided for aligning an additional mask alignment mark with respect to an additional substrate alignment mark.

14. A lithographic apparatus for producing semiconductor devices, comprising:

a source of illumination radiation;

a mask disposed in illumination radiation from said source of illumination radiation, said mask having a first alignment mark formed therein, said first alignment mark being a diffraction grating;

a substrate disposed in said illumination radiation from said source of illumination radiation, said substrate having a second alignment mark formed therein, said second alignment mark being a second diffraction grating having a depth profile;

a projection system arranged between said mask and said substrate, said projection system adapted to project an image of said mask onto said substrate;

an alignment radiation source producing substantially monochromatic alignment radiation having a wavelength of the order of 1000 nm and at most 1100 nm, said alignment radiation leading to reduced alignment errors relative to alignment errors obtained with alignment radiation of 540 nm, 633 nm and 620 nm;

a detector of alignment radiation; and an alignment optical system directing alignment radiation to said first and second alignment marks, and directing diffracted alignment radiation from said first and second alignment marks to said detector.

15. A lithographic apparatus for producing semiconductor devices according to claim 14, wherein said alignment radiation source is a Nd:YAG laser producing alignment radiation with a wavelength of 1064 nm.

16. A lithographic apparatus for producing semiconductor devices according to claim 14, wherein said alignment radiation source is a Nd:YLF laser producing alignment radiation with a wavelength of 1047 nm.

17. A lithographic apparatus for producing semiconductor devices according to claim 14, wherein said alignment radiation source is a semiconductor laser producing alignment radiation with a wavelength of 980 nm.

18. A lithographic apparatus for producing semiconductor devices according to claim 14, wherein said alignment radiation has a wavelength of at least 980 nm and smaller than 1100 nm.

19. A method of producing semiconductor devices, comprising:

illuminating a first alignment mark on a substrate with an alignment beam of radiation having a wavelength of the order of 1000 nm and at most 1100 nm, said first alignment mark being a diffraction grating having a depth profile;

illuminating a second alignment mark on a mask with said alignment beam of radiation;

directing diffracted radiation from said illuminated first and second alignment marks to a detector;

adjusting a relative position of said mask with respect to said substrate based on information extracted from said diffracted radiation detected;

illuminating said mask with a primary beam of electromagnetic radiation having a wavelength less than 633 nm; and projecting an image of said illuminated mask onto said substrate, wherein said alignment radiation leads to reduced alignment errors relative to alignment errors obtained with alignment radiation of 540 nm, 633 nm and 620 nm.

20. A method of producing semiconductor devices according to claim 19, wherein said alignment radiation source is a Nd:YAG laser producing alignment radiation with a wavelength of 1064 nm.

21. A method of producing semiconductor devices according to claim 19, wherein said alignment radiation source is a Nd:YLF laser producing alignment radiation with a wavelength of 1047 nm.

22. A method of producing semiconductor devices according to claim 19, wherein said alignment radiation source is a semiconductor laser producing alignment radiation with a wavelength of 980 nm.

23. A method of producing semiconductor devices according to claim 19, wherein said alignment radiation has a wavelength of at least 980 nm and smaller than 1100 nm.

* * * * *